(12) United States Patent
Leon

(10) Patent No.: US 7,248,065 B2
(45) Date of Patent: Jul. 24, 2007

(54) ARCUATE BLADE PROBE

(75) Inventor: Alexander Leon, Santa Clara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/221,258

(22) Filed: Sep. 6, 2005

(65) Prior Publication Data

US 2006/0238208 A1 Oct. 26, 2006

Related U.S. Application Data

(63) Continuation-in-part of application No. 11/112,279, filed on Apr. 22, 2005, now abandoned.

(51) Int. Cl.
*G01R 31/02* (2006.01)

(52) U.S. Cl. .................................. 324/761

(58) Field of Classification Search ............... None
See application file for complete search history.

(56) References Cited

U.S. PATENT DOCUMENTS

| 4,675,600 | A | * | 6/1987 | Gergin ..................... 324/754 |
| 5,009,613 | A | * | 4/1991 | Langgard et al. ........... 439/482 |
| 5,225,773 | A | * | 7/1993 | Richards ................... 324/754 |
| 6,104,205 | A | * | 8/2000 | Mawby ..................... 324/761 |
| 6,377,059 | B2 | * | 4/2002 | Vinther et al. ............. 324/754 |
| 6,538,424 | B1 | | 3/2003 | Campbell |
| 6,809,535 | B2 | | 10/2004 | Campbell |
| 6,842,023 | B2 | * | 1/2005 | Yoshida et al. ............. 324/754 |
| 7,040,526 | B2 | * | 5/2006 | Negishi et al. ............. 228/103 |

OTHER PUBLICATIONS

"Technical Source Book" by IDI. Mar. 15, 2005, three pages.*
Joh O'Connell, Study and recommendations into using lead free printed circuit board finishes at manufacturing in circuit test stage, Agilent Technologies Electronic Manufacturi.
David Suraski Aim & Matt Parker, Considerations for the pin probe testing of no-clean solder paste residues.
John M Radman, Guide to testing lead-free product, Trace laboratories-east Technical Spotlight.
Challenges and opportunities in lead-free solder PCB assembly, Global SMT & Packaging ,Oct. 2002 , www.globalsmt.net.
Dr Dongkai Shangguan, Study of Compatibility for lead-free solder PCB Assembly, Flextronics San Jose, CA.
Kevin Hu, Recommended Design, Integration and Rework Guidelines for International Rectifier's BGA and LGA Packages, International rECTIFIER Application Note an-1028.

(Continued)

*Primary Examiner*—Paresh Patel

(57) ABSTRACT

An arcuate blade probe is disclosed. The arcuate blade probe includes a shaft with a pair of faces that converge towards each other along a probe axis and terminate at a single edge that includes an arcuate profile. The arcuate profile provides a surface that makes an electrical connection between the edge and a node to be probed. The connection can be made along at least one portion of the edge. The edge can be used to probe lead-based and lead-free solder on the pads of vias and test pads. The arcuate profile give the edge a gradual arc that does not come to a sharp point so that the edge can probe vias with plugged holes.

11 Claims, 15 Drawing Sheets

OTHER PUBLICATIONS

Lee W Ritchey, Anatomy of a Plated Through Hole, Copyright, speeding edge Oct. 2, 2001.
Lead Poisoning affects thousands of children and adults, www.lead-poisoning-news.com.
Jill Schildhouse, EU leading the lead-free way, Feb. 2005 Inside supply anagement, vol. 16, No. 2, p. 20.
Rob Spiegel, Threat of tin whiskers haunts rush to lead-free, Electronic new, Mar. 17, 2005.

* cited by examiner

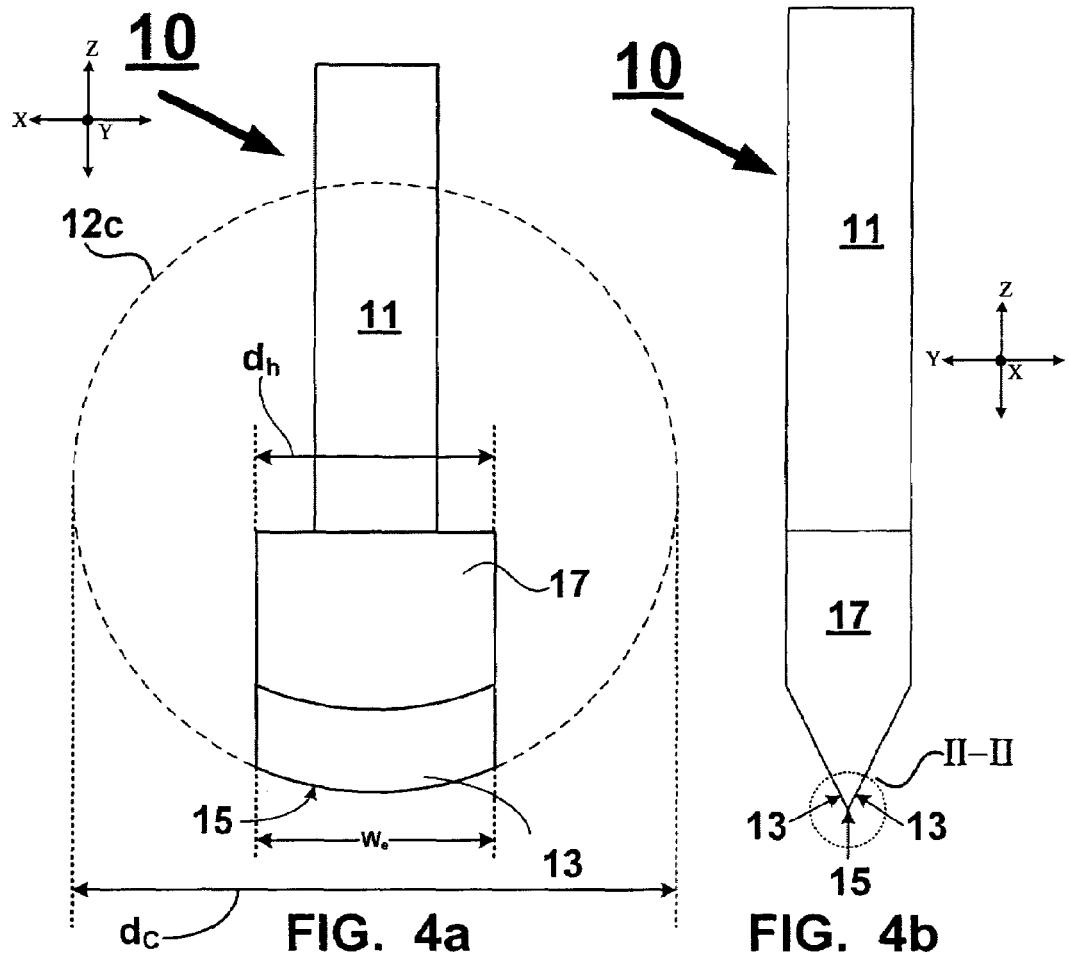
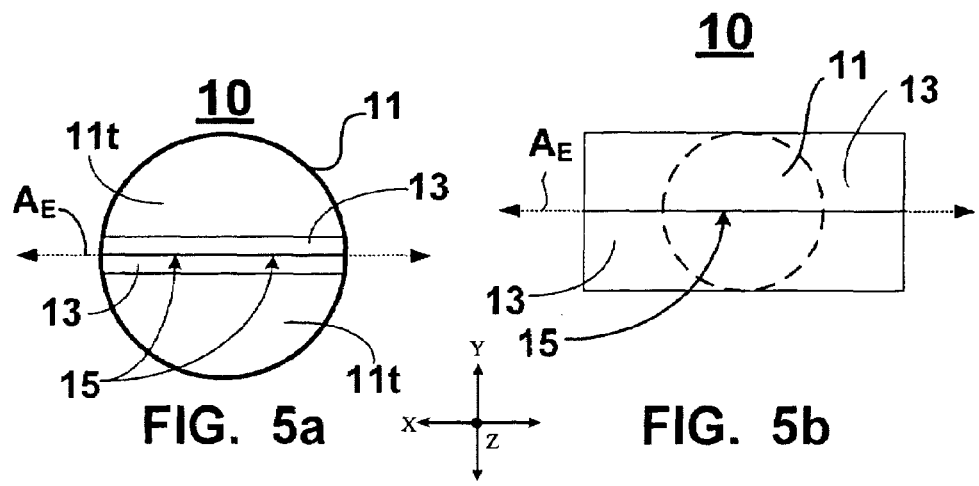

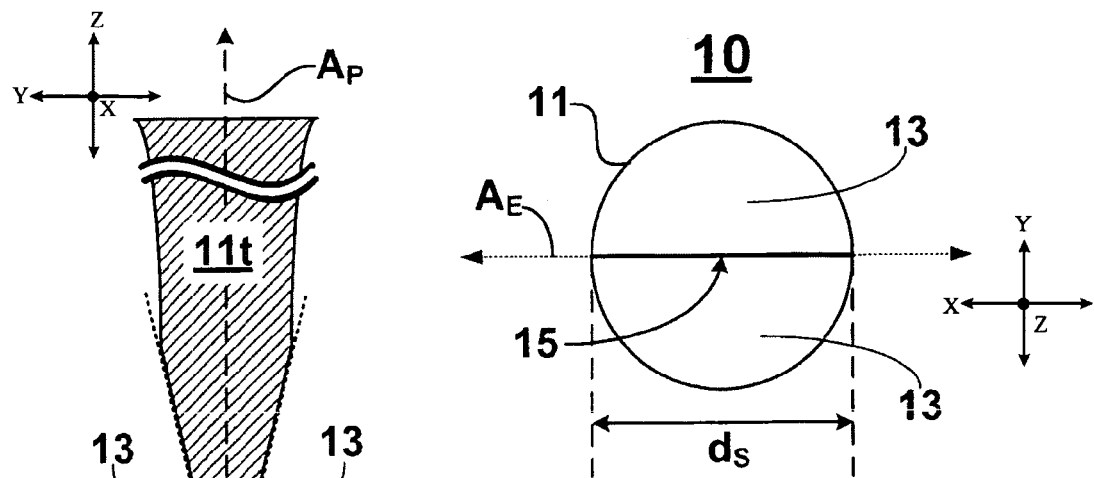
FIG. 5c
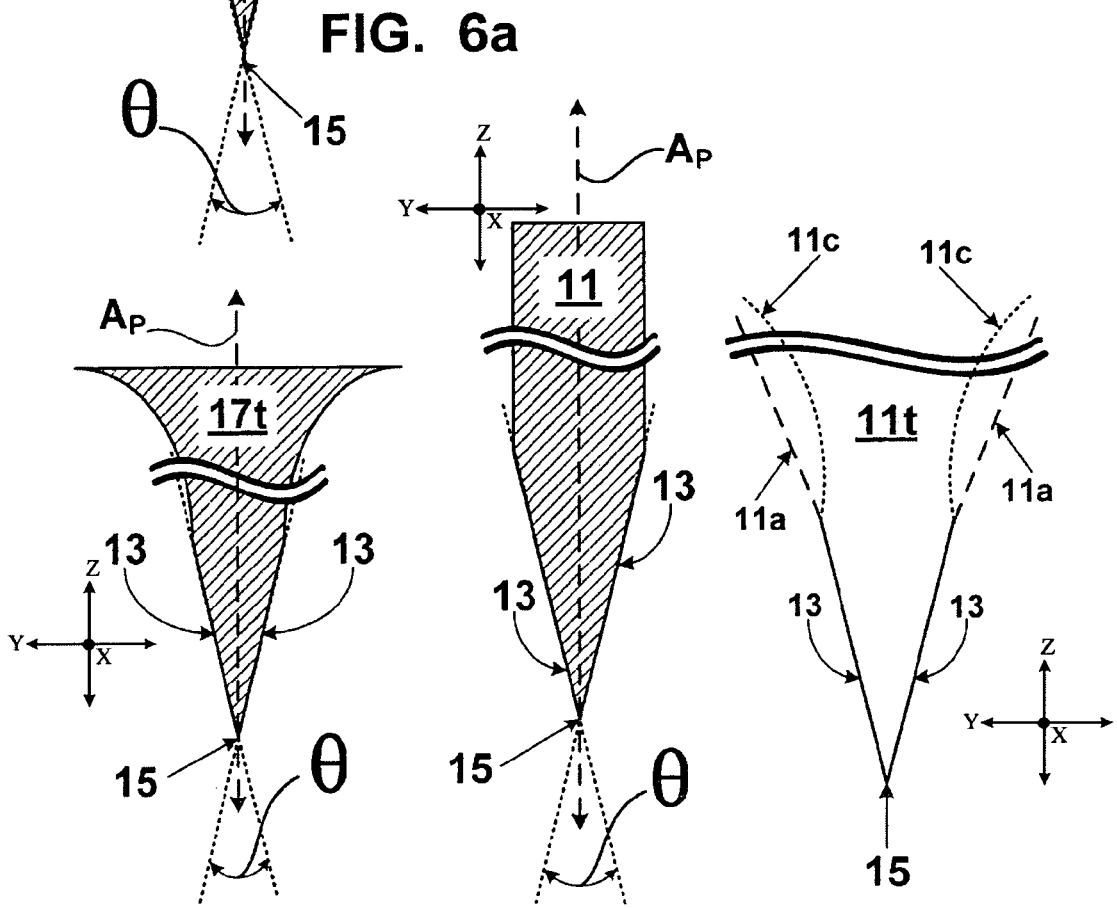
FIG. 6a
FIG. 6b   FIG. 6c   FIG. 6d

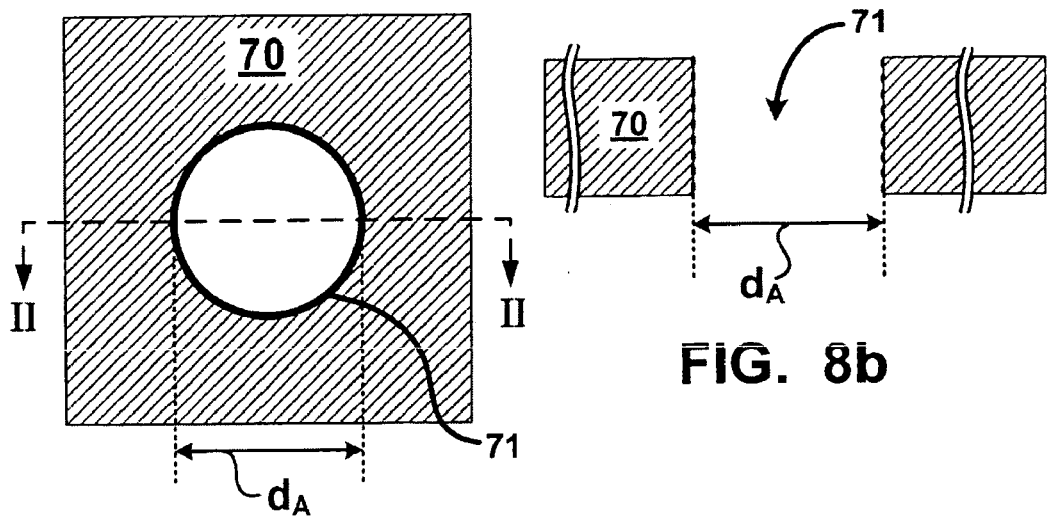
FIG. 8a
FIG. 8b
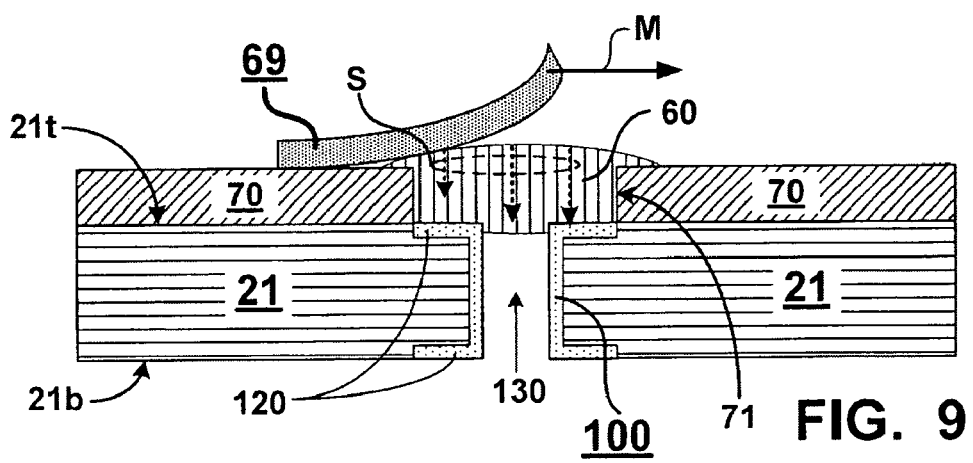
FIG. 9
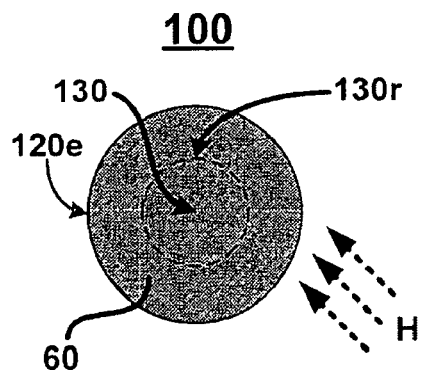
FIG. 10a
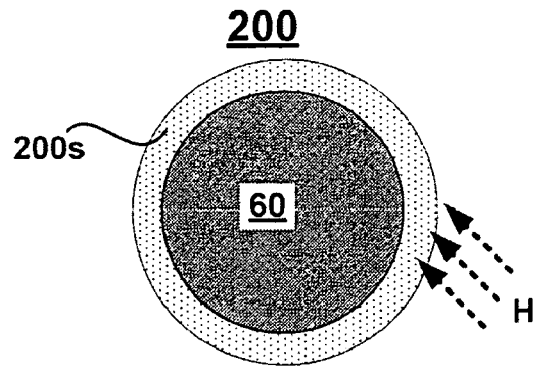
FIG. 10b

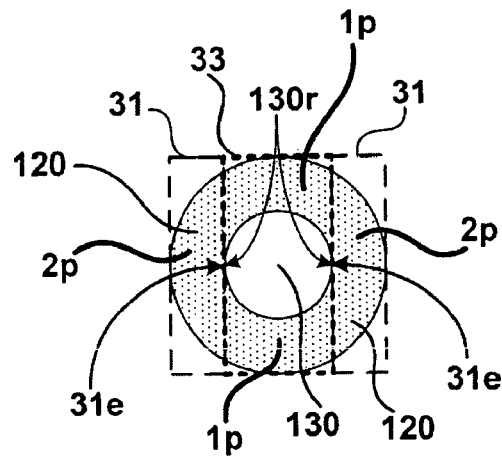
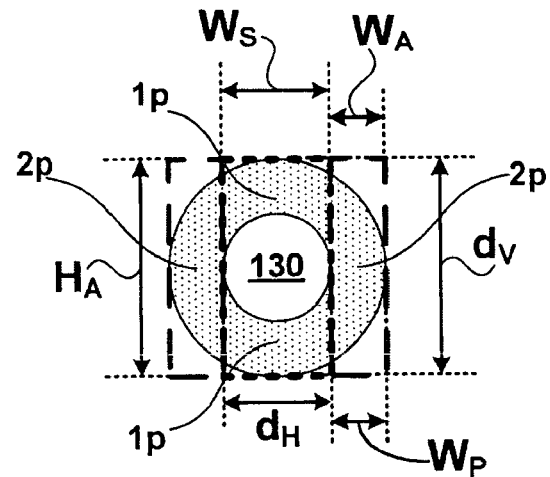
FIG. 16a  FIG. 16b
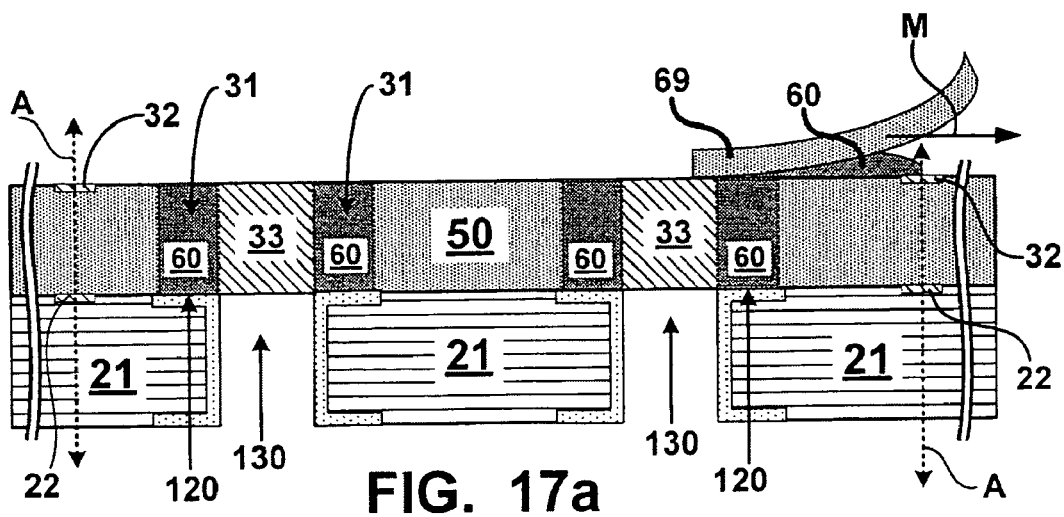
FIG. 17a

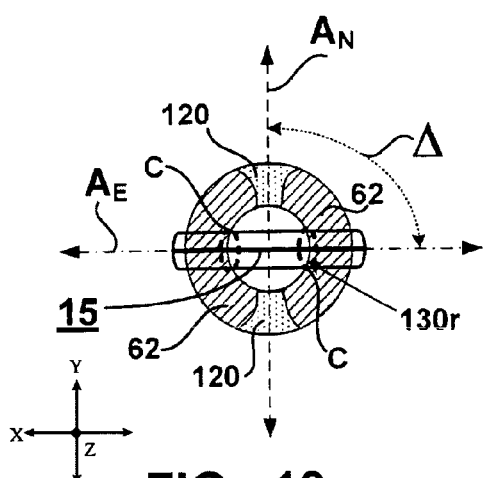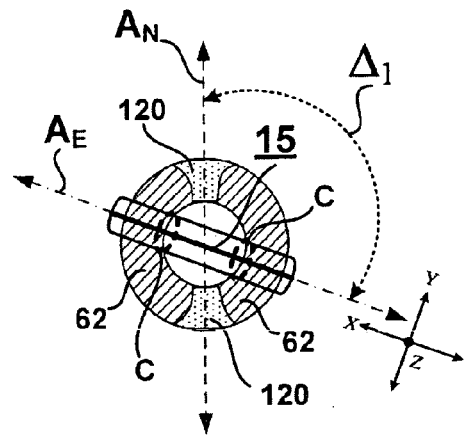
FIG. 18a    FIG. 18b
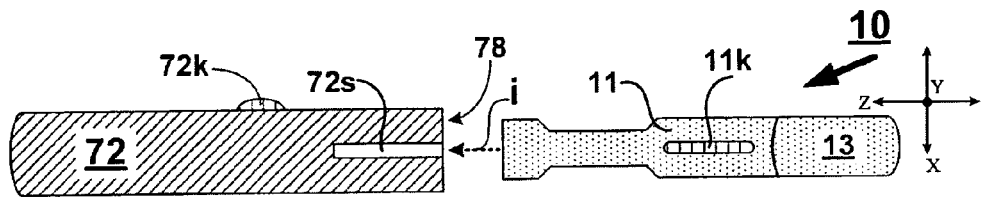
FIG. 19a
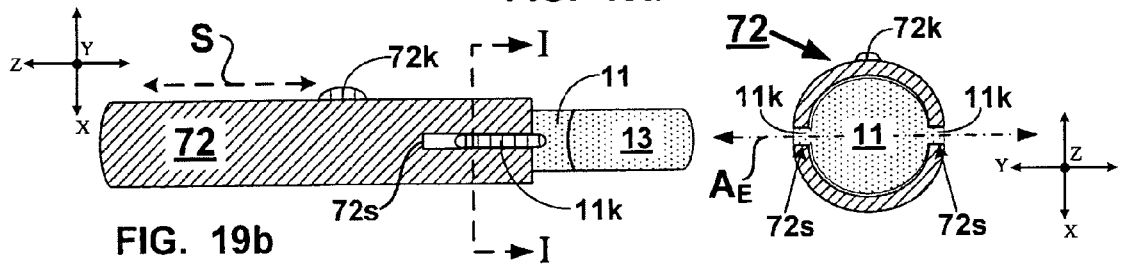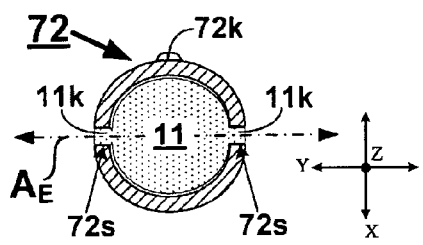
FIG. 19b    FIG. 19c
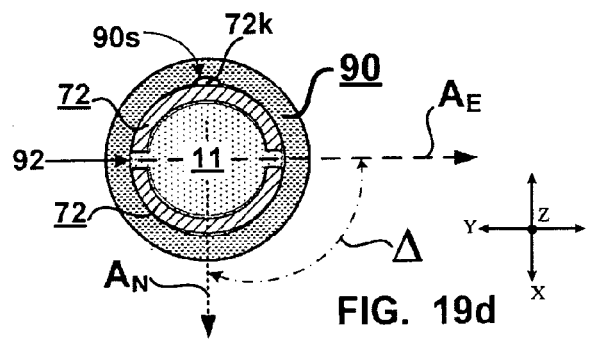
FIG. 19d

ARCUATE BLADE PROBE

RELATED APPLICATIONS

This application is a continuation-in-part (CIP) of patent application Ser. No. 11/112,279, filed Mar. 3, 2005.

FIELD OF THE INVENTION

The present invention relates generally to an arcuate blade probe. More specifically, the present invention relates to an arcuate blade probe including an edge with an arcuate profile.

BACKGROUND OF THE INVENTION

Printed circuit assemblies (PCA's), such as printed circuit boards (PCB's) that include electronic components soldered to the PCB, are used in a majority of electronic products. Those products include consumer electronics products such as personal computers, laptop computers, hard disc drives, cell phones, personal digital assistants (PDA's), digital music players, and video display and playback systems, just to name a few. Contact repeatability failures during an in-circuit-test (ICT) of the PCA's is one factor that effects a manufacturing cost and a reliability of electronic products.

The contact repeatability failures are due to probes (also called plungers) that are connected with a test fixture that is positioned relative to the PCA so that a tip of the probe contacts a test point on the PCA. Typically, the test point is a test pad, a through hole via, or a blind via connected with the PCA. For economic and environmental reasons, a no-clean manufacturing process is preferred to assemble PCAs during which paste is applied to test vias or test pads with a lead-based or lead-free solder paste. After the pasting, the solder paste is heated to reflow the solder paste so that a solder component of the paste wets a pad surface of the via or test pad. The reflowing also causes a flux component of the paste to be released. The resulting flux pools in the via holes or in an areas surrounding the test via pads can result in the aforementioned contact repeatability failures by preventing the test probe from making electrical contact with the via.

For example, in the case of a via, during reflow, a portion of the solder wets a pad of the via and another portion of the solder flows into a hole of the via and partially or completely fills the hole. Additionally, the flux also flows into the hole and pools on top of the solder. As a result, the hole is clogged by the flux/solder and the clog can be partially recessed below a level of the pad, can be flush with the pad, or can extend above the level of the pad. During ICT when the probe on the test fixture is urged into contact with the via in order to electrically contact the solder on the pad, a plunger tip of the probe cannot enter into the hole due to the clogging. Consequently, an electrical contact between the probe and the solder is prevented and the ICT may indicate that the unit-under-test (UUT) is defective because of a contact failure between the probe and the via. Examples of prior plunger tip styles that may not reliably contact the solder on the test point include single needle tips, headed and headless, chisel tips, spear tips, star tips, multi-sided arrowhead tips, and multi-pointed crown and tulip tips, just to name a few.

The economic impact of contact repeatability failures include passing bad boards, rejecting or discarding good boards, down time necessary to troubleshoot the test fixture or the UUT, increase warranty cost due to product failures in the field, unhappy consumers who purchase defective products, and loss of goodwill and brand loyalty due to defective products.

Prior solutions to the contact repeatability failures include not pasting the pads for lead-based processes that use a hot air solder leveling finish (HASL). However, the HASL finish has fallen into disfavor due to co-planarity issues. Other finishes such as ENIG and electrolytic nickel-gold (Ni/Au) can be used, but those finishes increase production costs and risk some intermetallic reliability issues. Immersion silver (Ag) is not as costly as ENIG or electrolytic Ni/Au but can result in reliability issues, whisker growth and solderability issues. Similarly, an immersion tin (Sn) finish poses a high risk of whisker growth and reliability issues. Another solution is solder paste overprinting; however, the overprinting requires the use of microvias which create problems of their own and can result in solder bleeding to the other side of the PCB creating an obstruction for pasting and loading components on the opposite side of the PCB. Finally, one solution includes wave soldering the test points along with other through hole components on the PCB. However, wave soldering solution is not suitable for all applications.

Of all of the aforementioned solutions, an organic solderability preservative (OSP) finish is the lowest cost and currently most reliable finish. OSP's are applied to a bare surface of a conductor (e.g. a copper trace or pad) on a PCB. The OSP's are applied after the PCB is manufactured to prevent oxidation of the copper conductors while the PCB awaits the assembly process where the solder paste is applied, components are loaded on the PCB, and the PCB is reflowed. By preventing oxidation of the copper, the OSP's ensure the solderability of the PCB. In general, all test points (e.g. vias or test pads) are more probable (i.e. have better contact reliability) when pasted and then reflowed so that the solder wets the surface of the pad.

Screen printing with no-clean lead-free solder paste which has a higher flux content results in flux pools and contamination. Consequently, plunger tips with multiple points become clogged by the high no-clean flux residue of the solder. Moreover, the high no-clean flux residue contaminates the pad or via so that electrical continuity cannot be established between the plunger tip and the UUT. Plunger tips with multiple points or edges can exasperate the contact reliability problem because a contact pressure of the plunger tip with the pad is a force being applied by the tip (usually via a helical coil spring) divided by a contact area of the tip with the pad. The contact area increases with the number of points/edges in contact with the pad and reduces the contact pressure. As a result, a pressure necessary to cut through the contamination on the pad is reduced and the plunger tip does not make an electrical contact with the solder on the pad.

Consequently, there is a need for a probe that includes a tip that overcomes the problems created by OSP's and a no-clean high flux content solder pasting process. There is also a need for a probe tip that reduces the number of edges that come into contact with a solder on a pad so that contact pressure is not compromised, and that also minimizes the risk of making contact with adjacent circuits if misaligned.

SUMMARY OF THE INVENTION

An arcuate blade probe for probing a node of a circuit includes a shaft made from an electrically conductive material. The shaft includes a pair of faces that are positioned about a probe axis in facing opposition to each other. The faces converge towards each other along the probe axis at a face angle and terminate at an edge. The edge includes an arcuate profile. When the edge and the node are urged into contact with each other, the edge makes a contact with the node along one portion of the edge or along two portions of the edge.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 4a and 4b depict a face view and a side view respectively of a headed arcuate blade probe.

FIG. 5a depicts an edge end view of the arcuate blade probes depicted in FIGS. 1 and 2.

FIG. 5b depicts an edge view of the arcuate blade probe depicted in FIG. 4a.

FIG. 5c depicts an edge view of the arcuate blade probe depicted in FIG. 3b.

FIGS. 6a, 6b, 6c are side angle views depicting examples of a side angle view for an arcuate blade probe.

FIG. 6d depicts examples of an arcuate taper and an angular taper for a shaft of an arcuate blade probe.

FIGS. 8a and 8b are top plan and cross-sectional views respectively of a stencil for applying a solder paste to a pad.

FIG. 9 is a cross-sectional view depicting a solder paste being applied to a pad of a via.

FIGS. 10a and 10b are top plan views depicting solder paste applied to a pad of a via and a test pad respectively.

FIG. 16a is a top plan view depicting a hole of a via and a first portion of a pad of the via covered by a shield of a pattern and a second portion of a pad covered by an aperture of the pattern.

FIG. 16b is a top plan view depicting dimensional relationships between a pattern and a via.

FIG. 17a is a cross-sectional view depicting an applying of a lead-free solder paste to a pad of a via through the apertures of a stencil.

FIG. 18a is a top plan view depicting a preferred orientation of an edge of an arcuate blade probe relative to a lead-free solder on a pad of a via.

FIG. 18b is a top plan view depicting an alternative orientation of an edge of an arcuate blade probe relative to a lead-free solder on a pad of a via.

FIGS. 19a through 19c depict one example of a structure for connecting an arcuate blade probe with a barrel with an axis of an edge disposed in a preferred orientation.

FIG. 19d depicts one example of a structure for connecting a barrel with a receptacle with an axis of an edge disposed in a preferred orientation.

DETAILED DESCRIPTION

Figure 1:
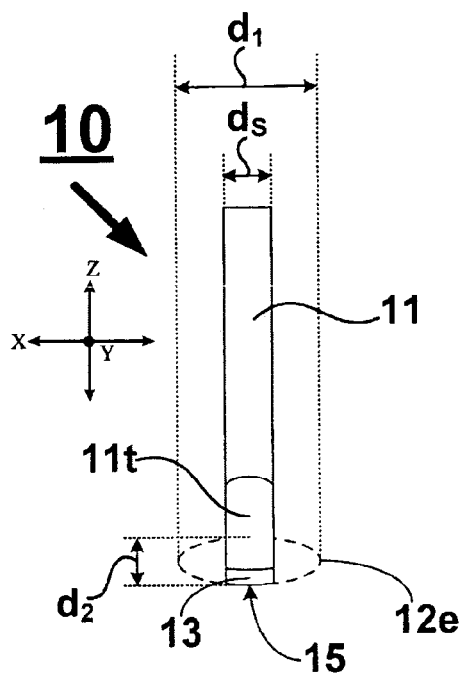
FIG. 1 depicts a face view of an arcuate blade probe with an edge including an elliptical profile.

In the following detailed description and in the several figures of the drawings, like elements are identified with like reference numerals.

As shown in the drawings for purpose of illustration, the present invention is embodied in an arcuate blade probe for probing a node of a circuit. The arcuate blade probe includes a shaft made from an electrically conductive material. The shaft includes a pair of faces that are symmetrically positioned about a probe axis in facing opposition to each other. The faces converge towards each other along the probe axis at a face angle and terminate at an edge. The edge includes an arcuate profile and the edge is aligned with the probe axis. When the edge and the node are urged into contact with each other, the edge makes a contact with the node along a portion or portions of the edge.

The arcuate blade probe makes contact with the node at any portion or portions along the edge when the probe and the node are urged into contact with each other. Pressure at the portions of contact is higher than if the edge was a straight edge. Additionally, the arcuate edge avoids the flux and contamination which prevents pointed tips from making contact with the node. The arcuate profile of the edge is useful for electrically probing a variety of node types, such as test pads, through hole vias, and blind vias that have been pasted with lead-based or lead-free solder.

The face angle and the contact pressure where the edge makes contact with the node allow the edge to penetrate contaminants that cover solder on the node so that a good electrical contact is made between the arcuate blade probe and the node. Moreover, the face angle and the arcuate profile reduce build up of contamination on the edge that can result in contact repeatability problems and down time for cleaning or replacing probes. Unlike prior plunger tips that include sharp points that contact the flux that plugs a hole of a via and therefore doesn't make an electrical contact with the node, the arcuate profile of the edge provides a surface without sharp protrusions so that one or two portions of the edge make contact only with the solder on the node.

a. An Arcuate Blade Probe

Figure 3A:
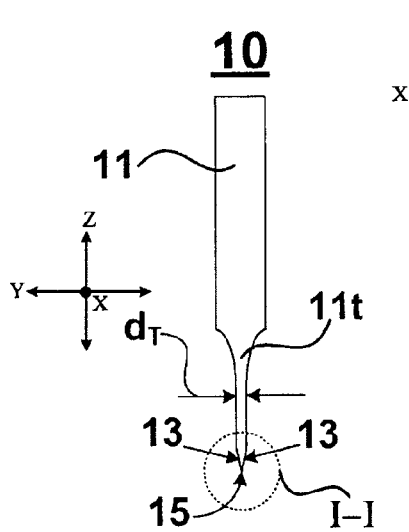
FIG. 3a depicts a side angle view of an arcuate blade probe.
Figure 3B:
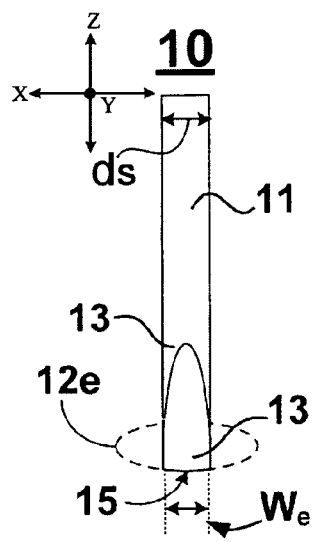
FIGS. 3b and 3c depict a face view and a side view respectively of an arcuate blade probe.

Referring to FIGS. 3a, 3b, 3c, 5a, and 6c an arcuate blade probe 10 includes a shaft 11 and a pair of faces 13 that are preferably symmetrically positioned about a probe axis $A_P$. The faces 13 are positioned in facing opposition to each other and the faces 13 converge towards each other along the probe axis $A_P$ at a face angle θ and terminate at an edge 15. That is, the faces 13 converge to form a single edge 15. The edge 15 is preferably aligned with the probe axis $A_P$ so that in FIG. 6c the probe axis $A_P$ passes through a vertex where the two faces 13 converge at the edge 15. In FIG. 3b, the edge 15 includes an arcuate profile. The arcuate profile can include but is not limited to a circular profile, an elliptical profile, an oval profile, any curved function or a combination of any of these. In FIG. 3b, the arcuate profile is an elliptical profile because the profile of the edge 15 traces a portion of an ellipse as denoted by an elliptical dashed line 12e.

The arcuate blade probe 10 can be made from an electrically conductive material including but not limited to brass, copper, beryllium copper, steel, stainless steel, aluminum, and titanium. Those materials may optionally be gold (Au) or other plated. The shaft 11 can have a circular cross-section as depicted in FIG. 5c, where the view is looking into the edge 15 with the probe axis $A_P$ pointing out of the drawing sheet. The arcuate profile of the edge 15 can span an entire diameter $d_S$ of the shaft 11 when the shaft 11 has the circular cross-section. An edge axis $A_E$ is colinear with the edge 15. The edge 15 has a width $W_e$, which can be the same as the diameter $d_S$.

Figure 3C:
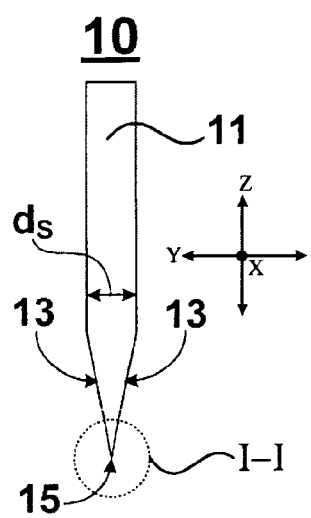

A section I—I of FIG. 3c is depicted in greater detail in FIG. 6c. The face angle θ will be application specific and will depend an several factors including but not limited to the diameter $d_S$ of the shaft 11, the type of node being probed (e.g. a via or a test pad), and the material of the shaft 11. Preferably, the face angle θ is in a range from about 10.0 degrees to about 35.0 degrees. The arcuate profile for the edge 15 and the face angle θ can be formed using manufacturing processes that are well understood in the probe art and include but are not limited to machining, milling, grinding, stamping, casting, molding, sharpening and polishing.

b. An Arcuate Blade Probe with a Tapered Shaft

Figure 2:
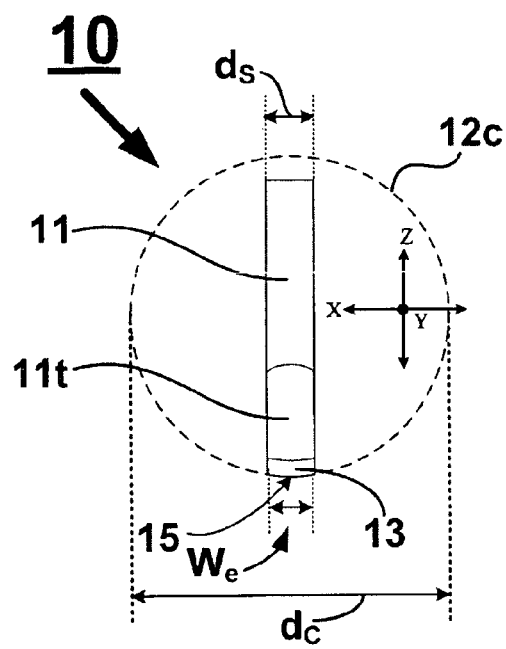
FIG. 2 depicts a face view of an arcuate blade probe with an edge including a circular profile.
Figure 11A:
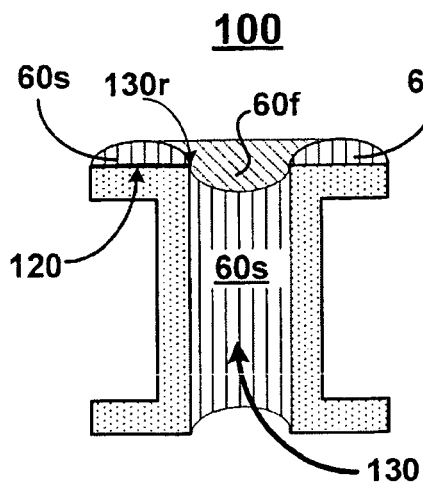
FIGS. 11a and 11b are cross-sectional views of through hole vias including solder and flux plugging a hole of the via after a reflow process.
Figure 11B:
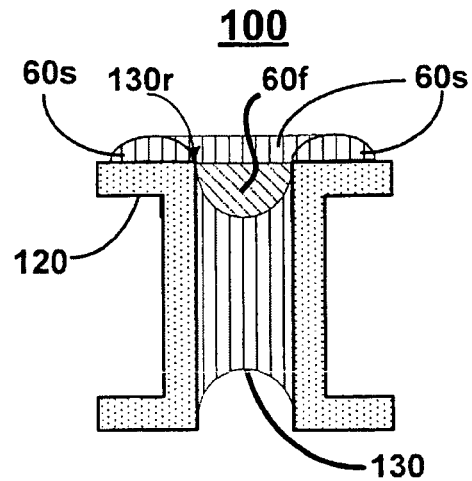
Figure 11C:
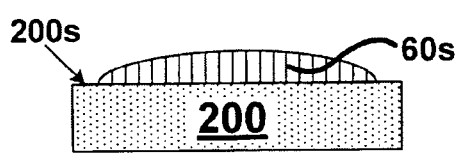
FIG. 11c is a cross-sectional view depicting a test pad with solder disposed thereon after a reflow process.
Figure 11D:
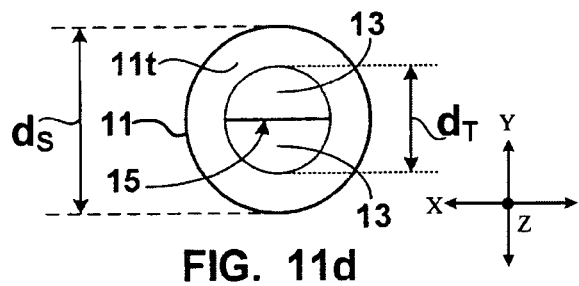
FIG. 11d depicts an edge end view of an arcuate blade probe with a tapered portion having a dimension that is smaller than a dimension of a shaft.

Turning to FIGS. 1, 2, 3a, 5a, 6a, and 11d the shaft 11 can include a portion 11t that tapers (i.e. reduces in dimension) in a direction towards the edge 15. The portion 11t includes the faces 13 and the edge 15. In FIG. 6d, the tapering to portion 11t can include an arcuate profile (see dashed line 11c), an angular profile (see dashed line 11a), a stepped profile (not shown) or a combination of these (not shown). In FIG. 5a, the portion 11t is depicted in a view looking into the edge 15 with the probe axis $A_P$ pointing out of the drawing sheet. The taper of the portion 11t eventually blends into the faces 13 which in turn terminate at the edge 15. Although the shaft 11 is depicted having a circular cross-section, the portion 11t may include a circular cross-section like the shaft 11 or a non-circular cross-section. A section I—I of FIG. 3a is depicted in greater detail in FIG. 6a., where the face angle θ can be in the same range as was describe above. Moreover, the shaft 11 can be made from the same materials as set forth above. The taper in the portion 11t can be selected to reduce the dimension of the shaft 11 so that the arcuate blade probe 10 can be used to probe small vias or the like. The taper portion can also be stepped as shown in FIG. 11d. Preferably, the tapering of the shaft should be gradual, so that collection of residue is minimized by facilitating a self-cleaning action.

The arcuate profile of the edge 15 can have an elliptical profile (see 12e in FIG. 1) or a circular profile (see 12c in FIG. 2). Although not depicted in FIG. 1 or 2, the arcuate profile can also be an oval profile, or any combination of elliptical, circular, oval or other curved function profiles. Referring to FIG. 1, for the elliptical profile 12e, a major diameter $d_1$ of the ellipse is preferably greater than the diameter $d_S$ of the shaft 11 and a minor diameter $d_2$ of the ellipse may be less than, equal to, or greater than the diameter $d_S$ of the shaft 11. Similarly, in FIG. 2, a diameter $d_C$ of the circular profile 12c is preferably greater than the diameter $d_S$ of the shaft 11. Here, the edge width $W_e$, is shown to be the same as the diameter $d_S$.

c. A Headed Arcuate Blade Probe

In FIGS. 4a, 4b, 5b, and 6b, the shaft 11 includes a head 17. The head 17 has a dimension $d_h$ that is greater than the dimension $d_S$ of the shaft 11. If the shaft 11 and the head 17 have circular cross-sections, then the dimensions $d_S$ and $d_h$ can be the diameters of the shaft 11 and the head 17 respectively. A portion of the head 17 tapers in a direction towards the edge 15 and the head 17 includes the faces 13 and the edge 15. The taper in a circular cross-section head (not shown) can have an arcuate profile, an angular profile, or a combination of arcuate and angular profiles as depicted in FIG. 6b and FIG. 6d). The edge 15 can include the circular, elliptical, and oval profiles, or any combination of curved profiles as previously described above. The head may also have a rectangular cross-section as depicted in FIGS. 4b and 5b with faces parallel to each other, which in turn taper on faces 13 towards the arcuate blade edge 15. In FIG. 5b, the dashed line for the shaft 11 depicts the smaller dimension $d_S$ of the shaft 11 relative to the dimension $d_H$ of the head 17. A section II—II of FIG. 4b is depicted in greater detail in FIG. 6c, where the face angle θ can be in the same range as was described above. Moreover, the shaft 11 and the head 17 can be made from the same materials as set forth above. The head 17 can be useful for probing nodes that are larger in dimension than the dimension $d_S$ of the shaft 11. The rectangular head 17 may be attached symmetrically on a common axis to the shaft 11 on one end, and forming the arcuate edge at the other end.

d. Probing of Nodes

Figure 7A:
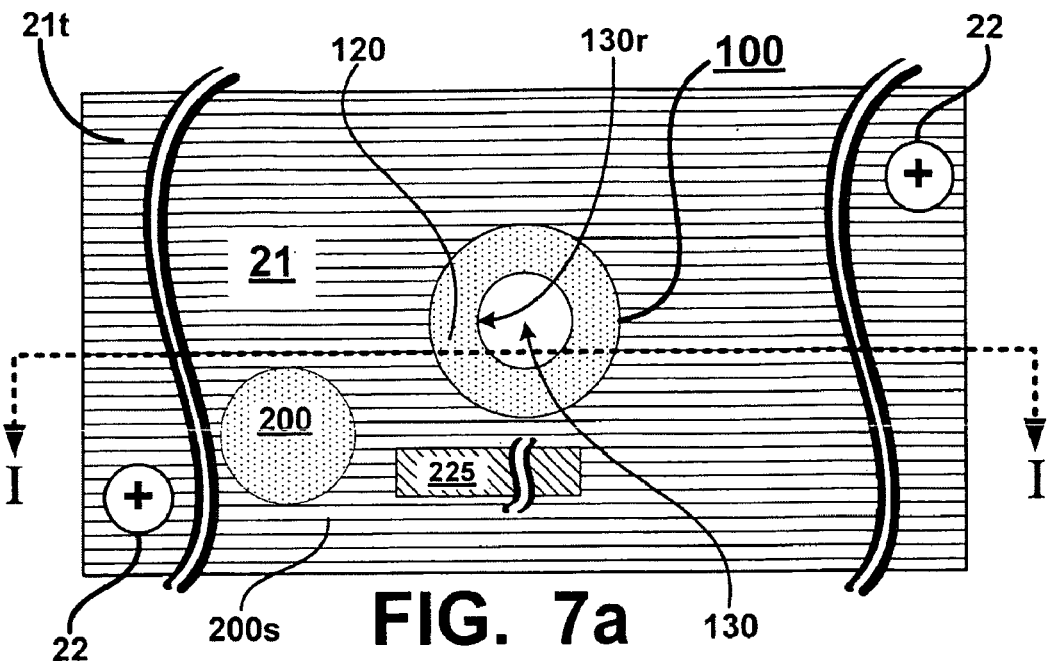
FIGS. 7a and 7b are top plan and cross-sectional views respectively of a board substrate including a via and a test pad.
Figure 7B:
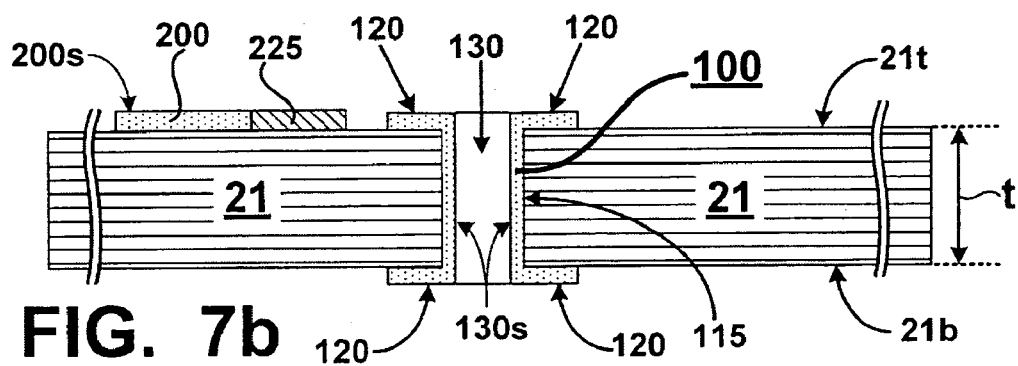

In FIGS. 7a and 7b a substrate 21 includes nodes 100 and 200. The substrate 21 can be a printed circuit board (PCB) or a printed circuit assembly (PCA). The node 100 is a through hole via that includes a pad 120, a hole 130 with an interior surface 130s that terminates at a rim 130r and an exterior surface 115. Although not depicted, those skilled in the electronics art will appreciate that the interior and exterior surfaces (130s, 115) can be in contact with conductive traces positioned at various levels within a thickness t of the substrate 21. The node 200 is a test pad that includes a pad surface 200s. A conductive trace 225 is in contact with the node 200. One skilled in the electronics art will also appreciate that the nodes (100, 200) may be in electrical communication with components that are connected with the substrate 21 and that the electrical communication can be established through the aforementioned traces. The type of nodes that can be probed by the arcuate blade probe 10 are not limited to those depicted herein. For example, the node 100 can be a blind via in which the hole 130 does not extend through both sides (21$t$, 21$b$) of the substrate 21. Hereinafter, the node 100 will be referred to as the via 100 and the node 200 will be referred to as the test pad 200.

Figures 7C, 7D:
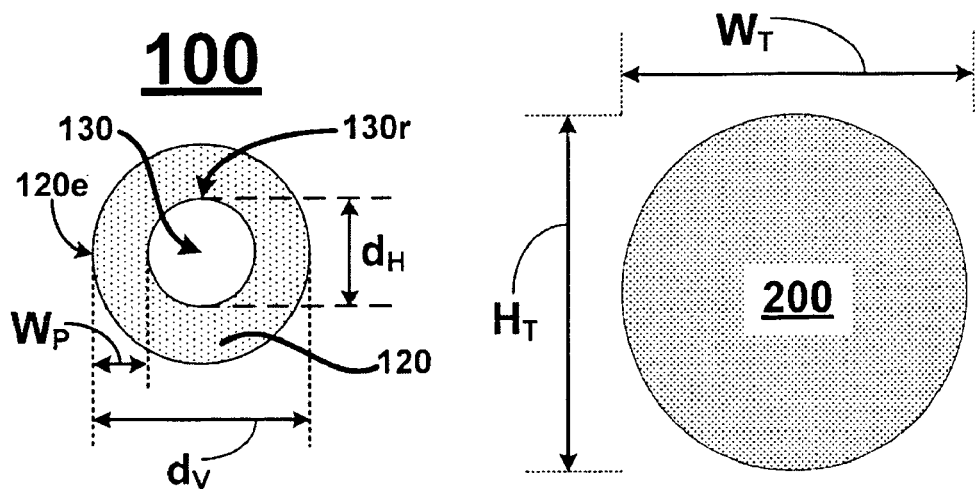
FIGS. 7c and 7d are top plan views depicting a pad of a via and a test pad respectively.

In FIG. 7$c$, the pad 120 of the via 100 includes a via diameter $d_V$, a hole diameter $d_H$, and a pad width $W_P$ as measured from an edge 120$e$ of the pad 120 to the rim 130$r$ of the hole 130. On the other hand, in FIG. 7$d$, the test pad 200 includes a width $W_T$ and a height $H_T$. Those dimensions are relevant in determining the dimensions of the arcuate blade probe 10 that are suitable for probing a particular node.

For instance, it is preferable in the case of the via 100, that the dimension width $W_e$ of the edge 15 be about that of the via diameter $d_V$ and always larger than the hole diameter $d_H$ by at least 10 mils and more preferably by 20 mils as an extra precaution to ensure that the edge 15 does not fit into the hole 130. Moreover, a finished hole size (FHS) of the diameter $d_H$ should be used as the starting point for determining how to appropriately size the dimension width $W_e$ of the edge 15. Although vias can be made to any desired size, typical via sizes for through hole or blind vias found in current PCB's and PCA's can have a via diameter $d_V$ in a range from about 25 mils to about 50 mils and a FHS diameter $d_H$ in a range from about 10 mils to about 20 mils.

As one example, for a via 100 with a diameter $d_V$ of 40 mils and a FHS diameter $d_H$ of 18 mils, a suitable dimension width $W_e$ of the edge 15 is in a range from about 28 mils to about 50 mils. As another example, for a via 100 with a diameter $d_V$ of 28 mils and a FHS diameter $d_H$ of 10 mils, a suitable dimension width $W_e$ of the edge 15 is in a range from about 20 mils to about 40 mils. The above examples apply when the dimension for the edge 15 as measured along the edge 15 is $d_S$ (see $d_S$ in FIG. 5$c$). However, when the shaft 11 tapers to the portion 11$t$, it is possible for a length of the edge 15 to be less than $d_S$ as is depicted in FIG. 11$d$ where a dimension $d_T$ of the portion 11$t$ is less than the dimension $d_S$. Therefore, the dimension $d_T$ should be selected so that it is greater than the FHS of the hole 130 by an appropriate amount (e.g. by 5 to 30 mils).

As yet another example, for a test pad 200 with a width $W_T$ of 50 mils and a height $H_T$ 50 mils, a suitable dimension $W_e$ for the edge 15 would be in a range from about 30 mils to about 60 mils. As will be described below, after the test pad 200 is pasted and reflowed, the solder wetting the surface 200$s$ may not cover the entire surface 200$s$; therefore, selecting the dimension $W_e$ to be about or equal to the smaller of $W_T$ or $H_T$ will ensure that the edge 15 is sufficiently wide along the edge axis $A_E$ to probe the solder.

Referring to FIGS. 8$a$ through 11$c$, one skilled in the electronics art will appreciate that vias, test pads, and the like are screen printed through a stencil with a solder paste to print the paste on the pads in preparation for a solder reflowing process. Accordingly, in FIGS. 8$a$ and 8$b$ a stencil 70 includes an aperture 71 that has a diameter $d_A$ that is sized to approximately the diameter $d_S$ of the via 100 or to be approximately the dimensions $W_T$ and/or $H_T$ of the test pad 200. In FIG. 9, the stencil 70 is positioned in contact with the substrate 21 so that the aperture 71 is positioned over the pad 120 of the via 100 and a solder paste 60 is printed on the pad 120 using a blade 69 that moves M across the stencil 70 to squeeze S the solder paste 60 through the aperture 71 and onto the pad 120. The solder paste 60 can be a lead-based solder paste or a lead-free solder paste. After the pasting process, in FIGS. 10$a$ and 10$b$, the pad 120 of the via 100 is covered with the solder paste 60 and a portion of the surface 200$s$ of the test pad 200 is covered with the paste 60. Heat H is applied to the paste 60 to reflow the paste so that a solder component of the paste 60 wets the pad 120 or the surface 200$s$. A flux component of the paste is also released by the reflowing process.

After the reflowing, in FIGS. 11$a$ and 11$b$, a solder 60$s$ from the paste 60 wets the pad 120 and a portion of the solder 60$s$ flows into the hole 130 and partially fills up the hole 130. Additionally, a flux 60$f$ released by the reflowing process, pools on top of the solder 60$s$. The flux 60$f$ may be flush with the rim 130$r$ as shown in FIG. 11$b$, be recessed below the rim (not shown), or may extend above the rim 130$r$ as depicted in FIG. 11$a$. The solder 60$s$ may wet the pad 120 all the way to its edge (see FIG. 11$a$) or the solder 60$s$ may be inset from the edge (see FIG. 11$b$). For the test pad 200, the result of reflowing is that the solder 60$s$ wets the surface 200$s$, but because there is no hole 130 to fill up, excess solder 60$s$ and flux 60$f$ flow off of the surface 200$s$ and onto an area surrounding the test pad 200 on the substrate 21. The excess solder 60$s$ and flux 60$f$ can accumulate in quantities sufficient to make contact with prior plunger tips and can result in the tip becoming contaminated and can block contact between the tip and the solder 60$s$ on the surface 200$s$. In either case, contact reliability can be compromised.

For the aforementioned prior plunger tips that rely on the tip to penetrate into the hole 130 so that a surface of the plunger tip can contact the solder 60$s$ of the via 100, the plugging up of the hole 130 by the solder 60$s$ and the flux 60$f$ can lead to contact reliability problems because the tip cannot penetrate into the flux 60$f$ in the hole 130; therefore, the surfaces of the plunger tip cannot make contact with the solder 60$s$ on the rim 130$r$. As a result, there is no electrical continuity between the prior probe and the node to be probed. Moreover, repeated contact between the plunger tip and the flux 60$f$ can cause the flux 60$f$ to accumulate on the plunger tip and contaminate the tip. The contamination can act like an insulating material that prevents electrical communication between the prior probe and the via 100.

Figure 12A:
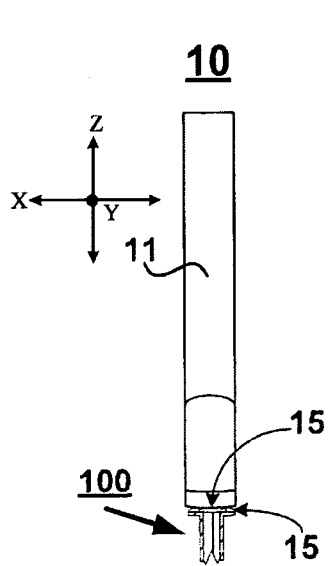
FIGS. 12a and 12b depict an edge face view and a side angle view respectively of an arcuate blade probe probing solder disposed on a pad of a via.
Figure 12B:
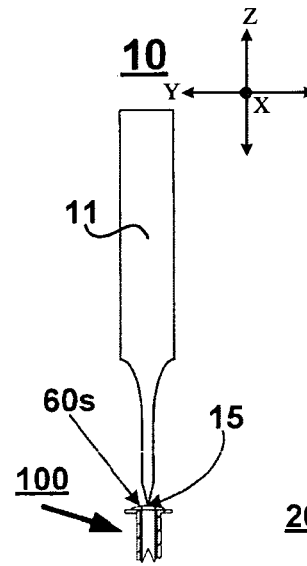
Figure 12C:
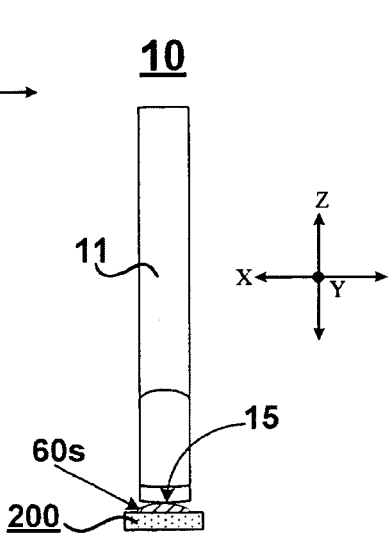
FIG. 12c depicts a test pad being probed by an arcuate blade probe.

In FIGS. 12$a$ through 12$c$, the arcuate profile of the edge 15 of the arcuate blade probe 10 can contact the solder 60$s$ on the pad 120 or the surface 200$s$ without being disturbed by pooled flux 60$f$ and solder 60$s$ in the hole 130 or by excess solder 60$s$ and flux 60$f$ that accumulate around the test pad 200, or the via 100.

e. Contact between the Edge and the Node

Figure 13A:
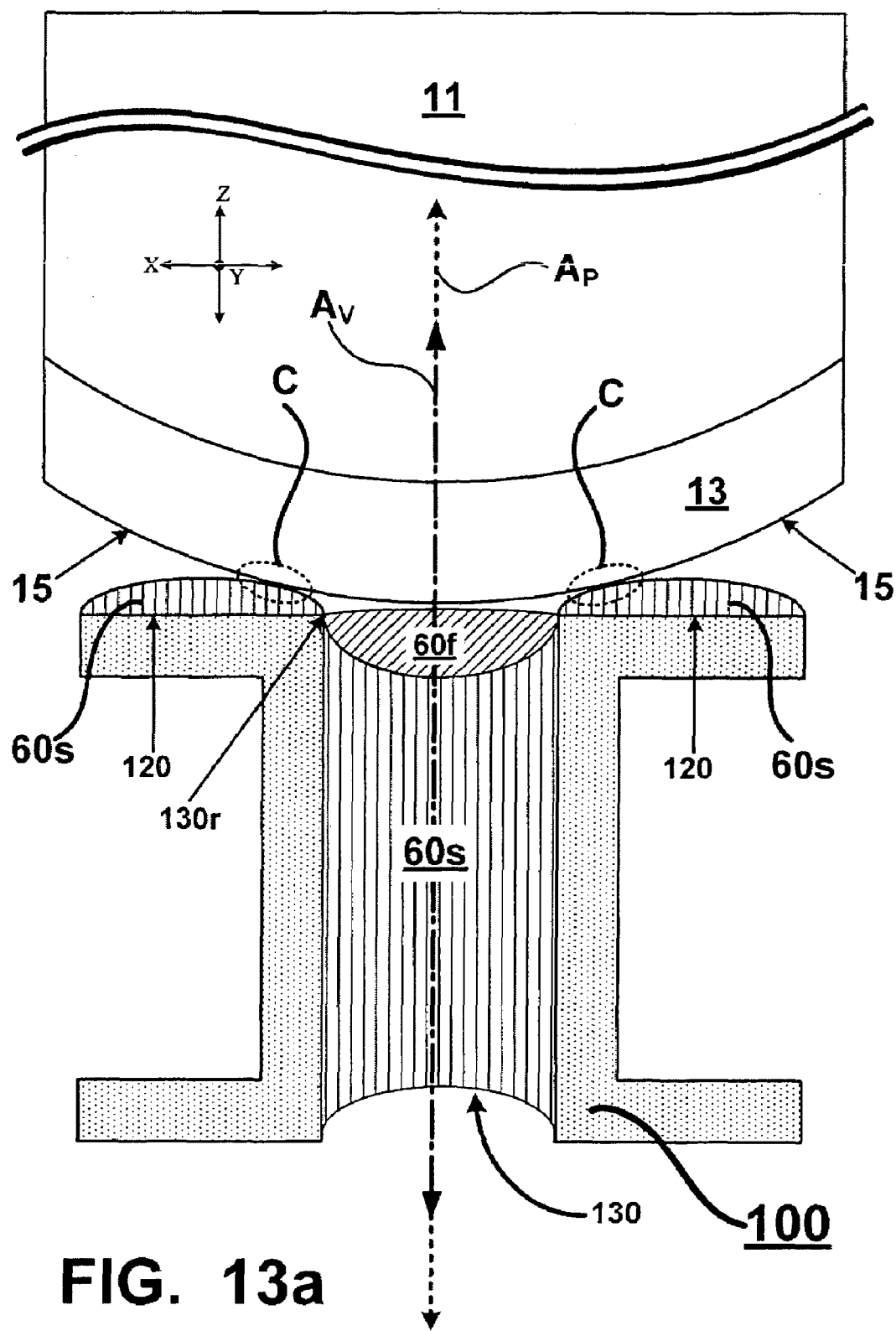
FIGS. 13a and 13b depict an arcuate blade probe with two portions of an edge in contact with solder on a pad of a via.

In FIG. 13$a$, a contact between the edge 15 and the solder 60$s$ on the pad 120 of the via 100 is depicted in greater detail. The solder 60$s$ wets the pad 120 and abuts with the rim 130$r$ of the hole 130. Additionally, solder 60$s$ and flux 60$f$ plug the hole 130. When the arcuate blade probe 10 and the via 100 are urged into contact with each other, the edge 15 makes a contact C with the solder 60$s$ at two portions along the edge 15 such that the arcuate blade probe 10 and the via 100 are in electrical communication with each other. Even though the flux 60$f$ extends outward of the hole 130 and above the rim 130$r$, the arcuate profile of the edge 15 doesn't make contact with the flux 60$f$. Consequently, a potential for the flux 60$f$ to accumulate on the edge 15 or the faces 13 is significantly reduced; thereby, reducing one possible source of contact reliability failure for the arcuate blade probe 10. This can be further ensured if the printed paste to the hole volume ration is kept below a certain ratio. For example, for lead free-solder, the solder to hole volume ratio is kept to 30% or less after reflow.

Figure 13B:
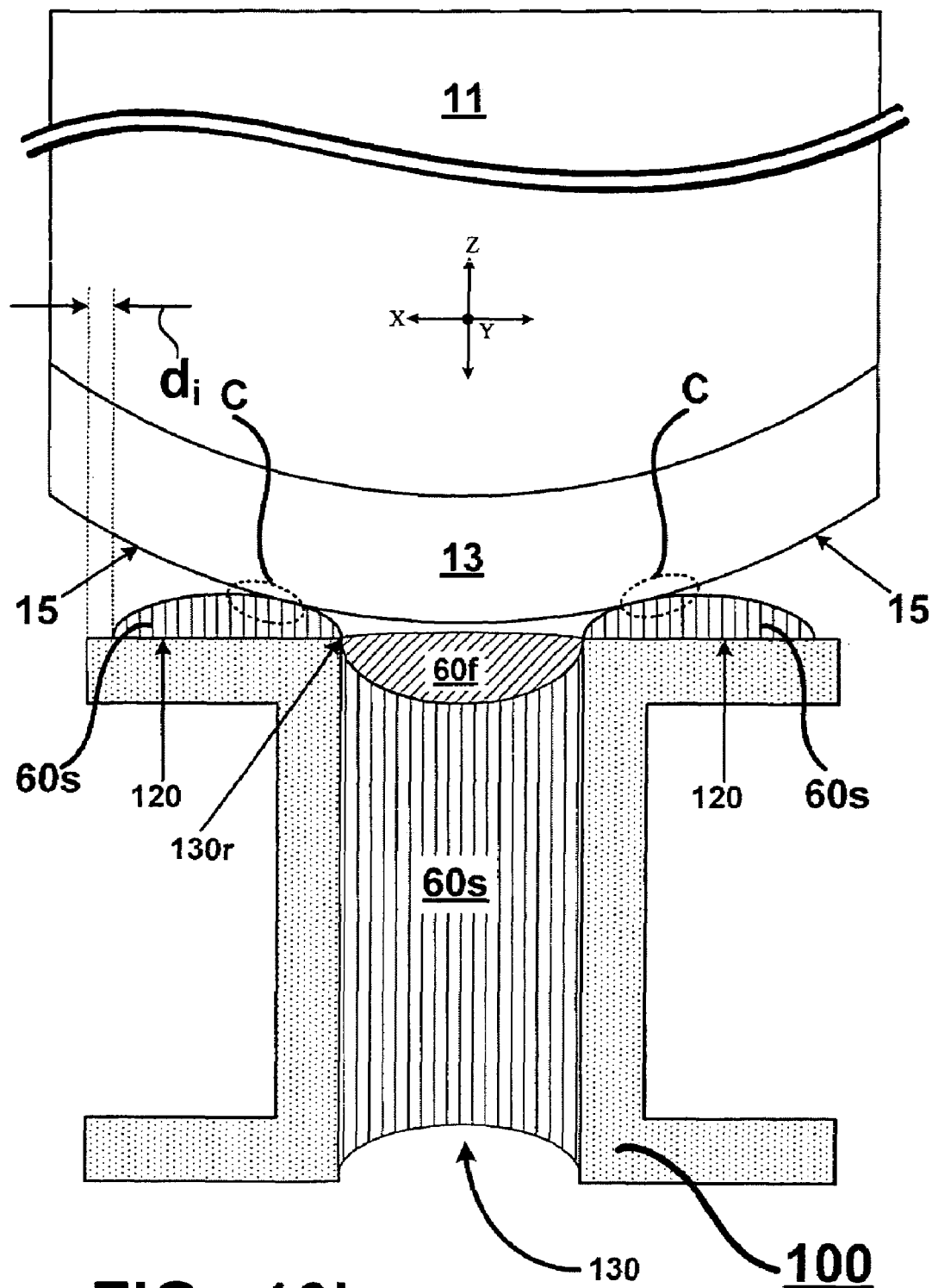
Figure 13C:
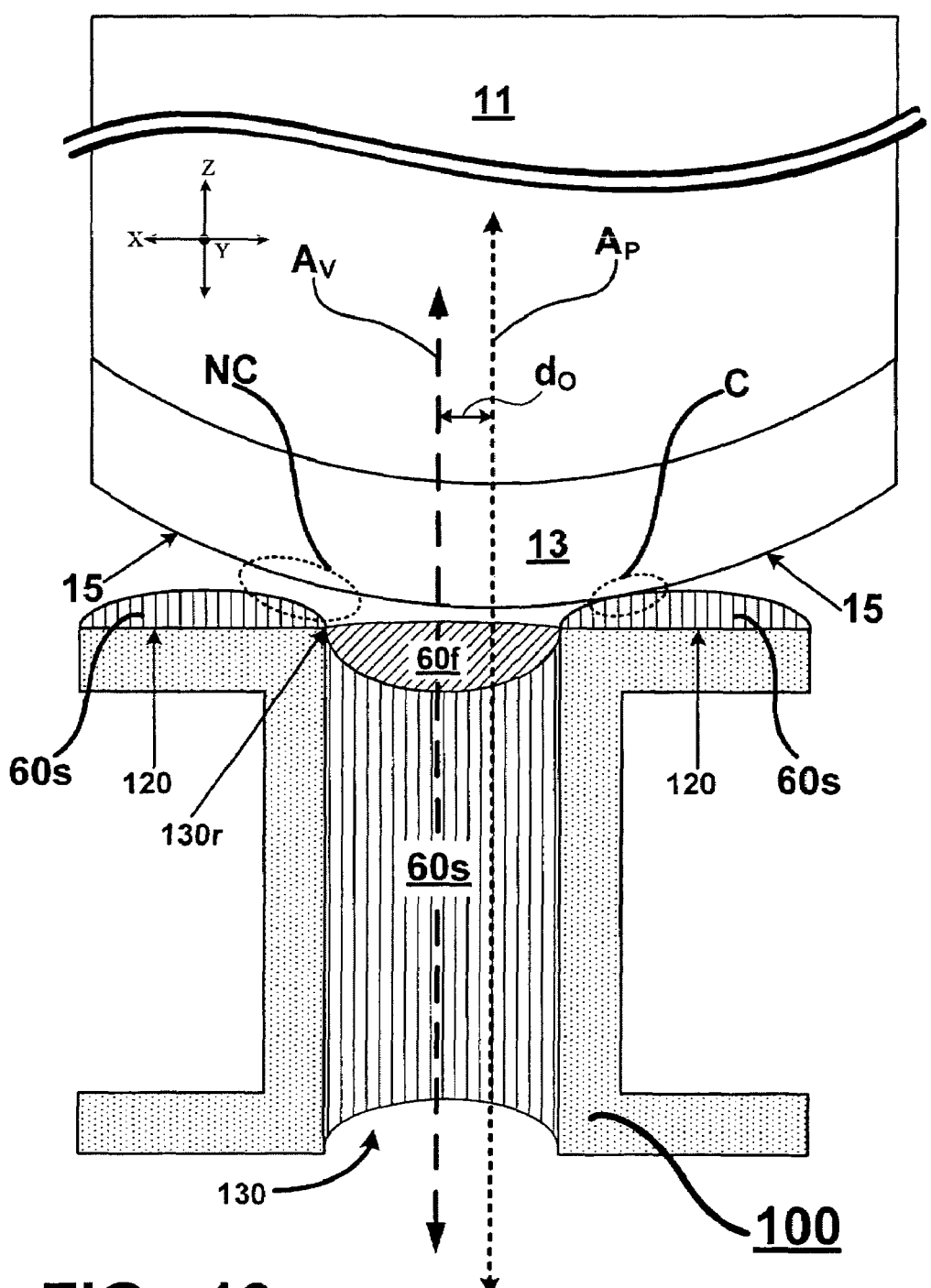
FIG. 13c depicts an arcuate blade probe with one portion of an edge in contact with solder on a pad of a via.

Referring now to FIG. 13b, the contact C between the edge 15 and the solder 60s can occur at two portions along the edge 15 even when the solder 60s is inset from the edge of the pad 120 by a distance $d_i$. The point of contact C along the edge 15 is slightly further out than was the case where the solder 60s extended all the way to the rim 130r in FIG. 13a. Therefore, another advantage to the arcuate blade probe 10 is that a reliable electrical connection between the node and the edge 15 can be made even when the solder 60s does not wet an entirety of the pad 120 and/or does not extend all the way to the rim 130r, or edge of the pad 120.

In FIG. 13a, the probe axis $A_P$ and a via axis $A_V$ are aligned with each other such that the arcuate blade probe 10 is substantially centered on a bore of the hole 130 of the via 100. In contrast, in FIG. 13c, the axes ($A_P$, $A_V$) are not aligned with each other and the probe axis $A_P$ is offset to the right of the via axis $A_V$ by a distance $d_O$. However, even with the axes non-aligned, the edge 15 makes a contact C with the solder 60s at one portion along the edge 15 such that the arcuate blade probe 10 and the via 100 are in electrical communication with each other even though another portion of the edge 15 is not in contact with the solder 60s (see NC in FIG. 13c).

The blade probe 10 can also compensate if the misalignment is not along the edge 15 of the blades. For example, if the misalignment is perpendicular to the edge of the blade probe 10, the edge 15 makes contact at two points which are increasingly closer to each other until the blade is tangential to the rim of the via 100. At that point the blade still makes contact across the with of the flange.

Figure 14A:
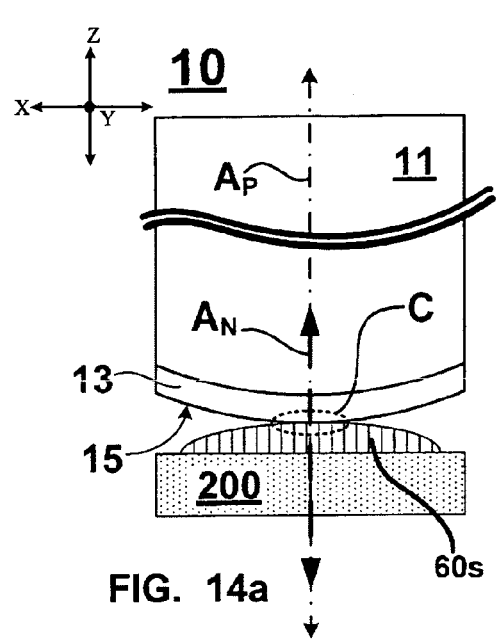
FIGS. 14a and 14b depict an arcuate blade probe with one portion of an edge in contact with solder on a test pad.
Figure 14B:
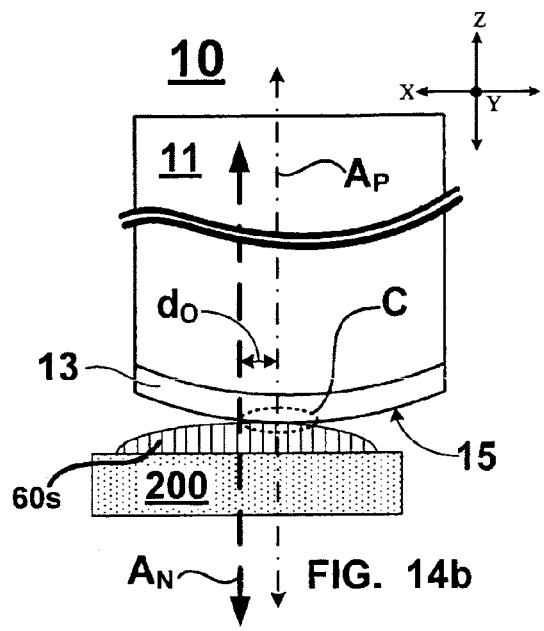

Turning now to FIGS. 14a and 14b, in the case of the test pad 200, the edge 15 makes a contact C with the solder 60s when the probe axis $A_P$ and a node axis $A_N$ are aligned with each other as depicted in FIG. 14a. However, the contact C with the solder 60s is also made when the probe axis $A_P$ and the node axis $A_N$ are not aligned with each other as depicted in FIG. 14b, where the probe axis $A_P$ is offset to the right of the node axis $A_N$ by a distance $d_O$. Therefore, the arcuate profile of the edge 15 allows for some misalignment error between the node to be probed and the arcuate blade probe 10 while still effectuating an electrical connection with the solder 60s connected with the node. Misalignment perpendicular to the edge 15 will also work.

f. Plunger, Barrels, and Receptacles

Figure 14C:
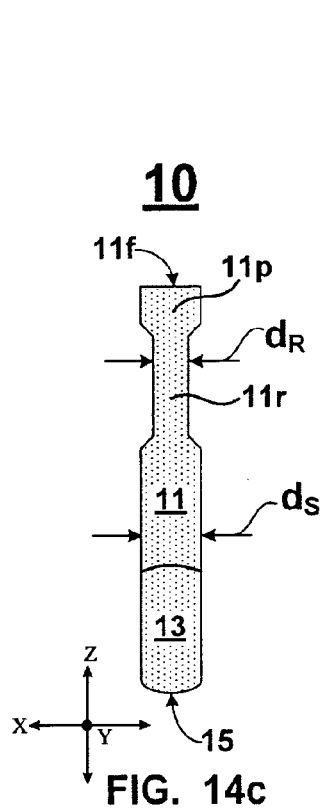
FIG. 14c depicts a shaft of an arcuate blade probe that includes a plunger body and a plunger tail.

The probe shaft 11 can be shaped to be received and retained in a barrel as is well understood in the electronics art. Accordingly, in FIG. 14c, the shaft 11 can include a plunger body 11r that includes a dimension $d_R$ that is less than the dimension $d_S$ of the shaft 11. If the shaft 11 is circular in cross-section, then the dimension $d_R$ can be a reduced diameter section of the shaft 11. The shaft 11 also includes a plunger tail 11p that is connected with the plunger body 11r. The plunger tail 11p can include a portion 11f that is adapted to engage a spring as will be described below.

Figure 14D:
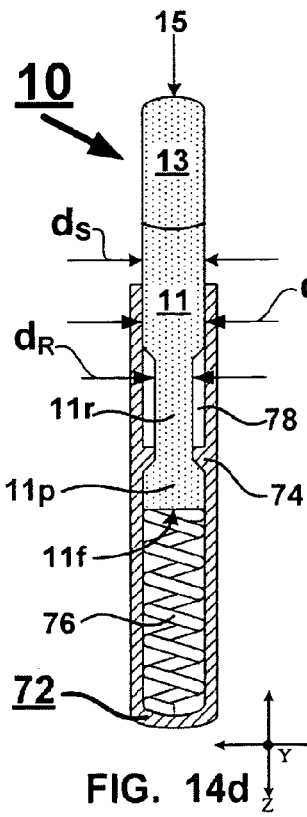
FIG. 14d is a cross-sectional view depicting a barrel and an arcuate blade probe positioned in the barrel.

In FIG. 14d, a barrel 72 includes a cavity 78 adapted to receive the shaft 11 and a spring 76 positioned in the cavity 78 and in contact with the plunger tail 11p. The barrel 72 also includes a structure 74 that retains the shaft 11 in the cavity 78 with the spring 76 compressed and in contact with the plunger tail 11p. There are several means for implementing the structure 74. For example, the shaft 11 can be inserted into the cavity 78 to compress the spring 76 and the barrel 72 can be intentionally deformed (i.e. crimped) so that the structure 74 reduces a dimension $d_S$ of the barrel 72 in the region proximate the plunger body 11r so that the plunger tail 11p is in contact with and is captured by the structure 74 and the shaft 11 is retained in the barrel with the spring 76 in compression and in contact with the plunger tail 11p. The portion 11f can be flat in order to provide a planar surface for the spring 76 to engage with. The dimension $d_B$ is selected so that the dimension $d_S$ of the shaft 11 will fit into the cavity 78 without binding and the shaft 11 can move up and down in the cavity 78 when the edge 15 is urged into contact with a node.

Figure 14E:
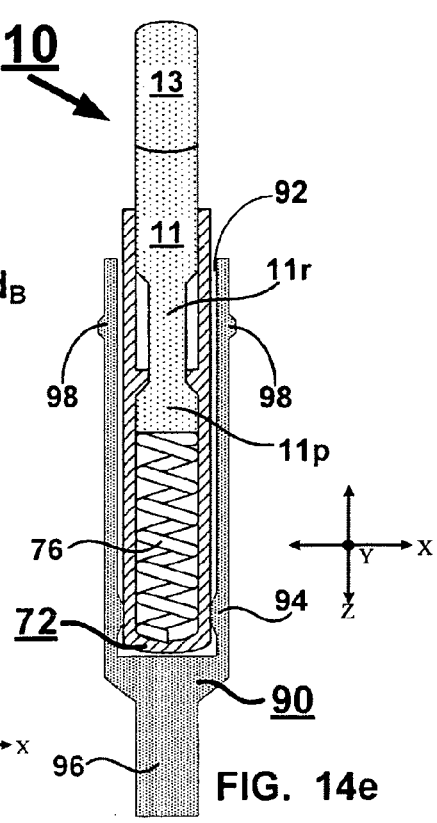
FIG. 14e is a cross-sectional view depicting a barrel inserted into a receptacle.

In FIG. 14e, a receptacle 90 includes a cavity 92 adapted to receive the barrel 72. The receptacle 90 can include a structure 94 that retains the barrel 72 in the cavity 92. As one example, the structure 94 can be a dimple that extends into the cavity 92 and provides a friction fit between the barrel 72 and the receptacle 90 so that the barrel 72 is retained in the cavity 92 but can be removed by applying a force sufficient to pull the barrel 72 out of the receptacle 90. The friction fit can also be used to rotate the barrel 72 in the receptacle 90 so that the edge 15 has a preferred orientation with respect to an axis of a node to be probe by the arcuate blade probe 10 as will be described below. The receptacle 90 is adapted to be connected with a test fixture (not shown). The test fixture can be of the kind used for ICT of PCB's and PCA's. A structure 98 on the receptacle 90 can be used to retain the receptacle 90 in a bore of the test fixture that is adapted to receive the receptacle 90. For example, the structure 98 can provide a friction fit between the bore and the receptacle 90. Moreover, the friction fit can be used to position the edge 15 in the aforementioned preferred orientation by rotating the receptacle 90 in the bore, for example. A section 96 of the receptacle 90 can be used to facilitate a connection of a wire (not shown) to the receptacle 90. The connection of the wire to the section 96 can be accomplished by crimping, wire wrapping, or soldering, for example.

g. Fabricating a Butterfly Pattern of a Lead-Free Solder

Because many countries are mandating by law, the elimination of lead-based solder from electronic products, many manufactures are turning to lead-free solder in the production of the PCB's and PCA's. However, the move to lead-free solder has problems of its own. Particularly, the higher solids content of the flux used in lead-free solder formulations. Essentially, a lead-free solder paste is reflowed and a higher volume of the flux component of the lead-free solder paste flows into the hole 130 of the via 100 and causes the aforementioned plugging of the hole 130.

One solution to the problems associated with the use of lead-free solder paste is to not over paste the pad 120 of the via 100. Typically, the aperture 71 of the stencil 70 has the diameter $d_R$ selected so that the solder paste 60 is applied to an entire surface area of the pad 120 so that the pad 120 is pasted at a ratio of 1:1 or greater than 1:1 (see FIG. 10a). The over pasting of the pad 120 places more solder 60s on the pad 120 than is necessary to effectuate a probing of the pad 120 and results in excess flux 60f flowing into the hole 130 and contributing to the plugging up of the hole 130.

Figure 15A:
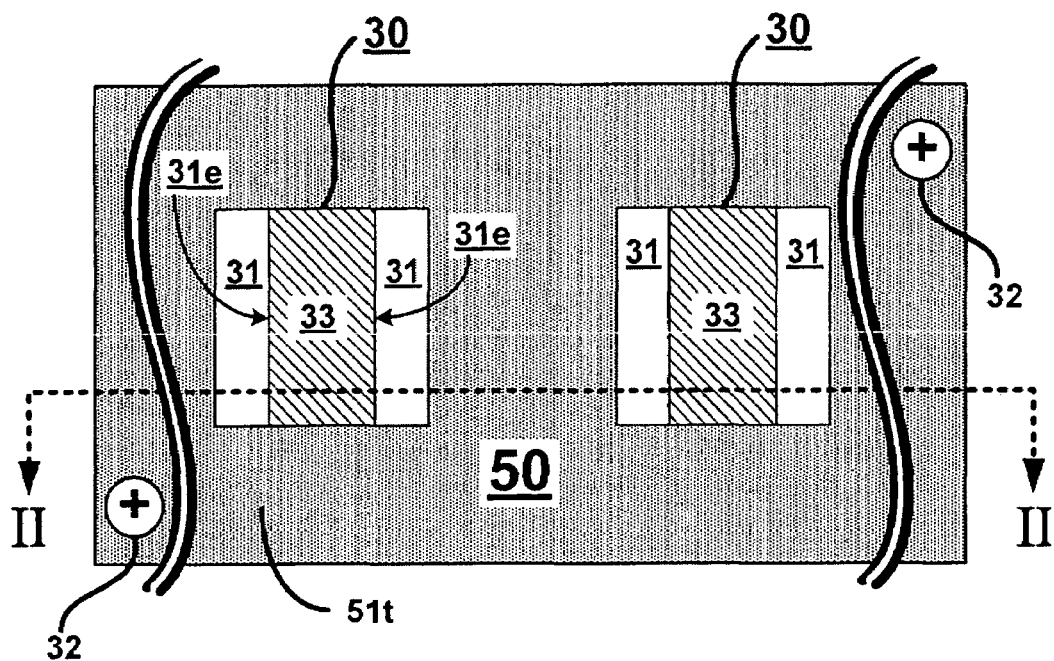
FIGS. 15a and 15b are a top plan view and a cross-sectional view depicting a stencil including a pattern that includes a shield and a plurality of apertures.
Figure 15B:
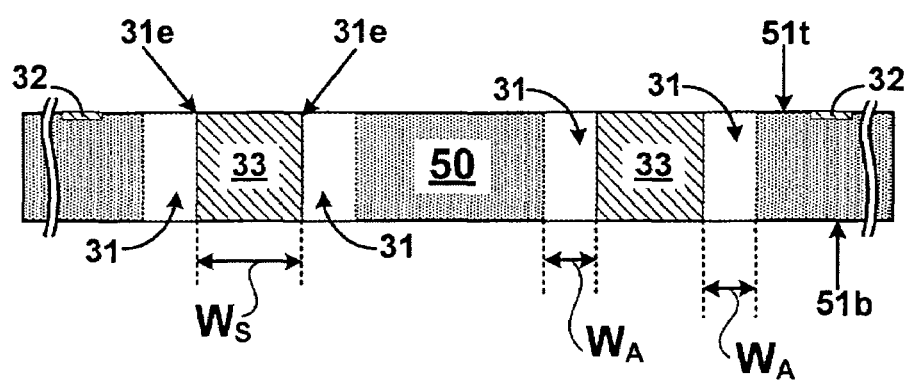

Reference is now made to FIGS. 15a and 15b, where a stencil 50 includes a pattern 30 with a plurality of apertures 31 and a shield 33. The apertures 31 extend between a top surface 51t and a bottom surface 51b of the shield 50. Although the shield 33 is depicted in hashed outline, the shield 33 can be made from the same material as the stencil 50 and the apertures 31 can be formed using a process such as stamping, cutting, punching, laser cutting, or perforating, for example. An edge 31e of the apertures 31 that are adjacent to the shield 33 may be aligned with the rim 130r in the hole 130 as will be described below. The stencil 50 can be made from the same materials that are customarily used for forming stencils for the printing of a lead-free solder paste on the vias and pads of a PCB or a PCA. The stencil 50 may also include one or more fiducial marks 32 that may be used to facilitate aligning the stencil 50 with the substrate 21 as will be described below.

The shapes of the apertures 31 and the shield 33 will be application specific and are not limited to the rectangular shapes depicted herein. Factors that can determine the shape of the apertures 31 and the shield 33 include but are not limited to a shape of the pad 120, the diameter $d_V$ of the via 100, the diameter $d_H$ of the hole 130, a surface finish on the pad 120, and a composition of the lead-free solder paste to be printed on the pad 120. A shape of the apertures 31 can include but is not limited to a rectangular shape, an arcuate shape, an angular shape, and a complex shape. Similarly, a shape of the shield 33 can include but is not limited to a rectangular shape, an arcuate shape, an angular shape, and a complex shape. For the discussion that follows, the apertures 31 and the shield 33 will have a rectangular shape.

In FIGS. 15b, 16a, and 16b, the shield 33 can have a width $W_S$ that is selected so that when the stencil 50 and the substrate 21 are aligned with each other and are positioned in contact with each other, the shield 33 will be positioned over the hole 130 and the width $W_S$ of the shield 33 will cover the hole 130 and a first portion 1p of the pad 120 as depicted in a dashed outline of the shield 33 in FIG. 16a. Similarly, the apertures 31 can have a width $W_A$ that is selected so that the apertures 31 are positioned over a second portion 2p of the pad 120 when the substrate 21 and the stencil 50 are aligned and in contact with each other as depicted by the dashed outline of the apertures 31 in FIG. 16a. In FIGS. 16a and 16b, the dashed outlines of the shield 33 and the apertures 31 depict a top view of a relative position of the pattern 30 and the via 100 when the stencil 50 and the substrate 21 are properly aligned with each other and are in contact with each other.

In FIG. 16b, the width $W_A$ of the apertures 31 can be selected so that the width $W_A$ is greater than, less than, or equal to the width $W_P$ of the pad 120. Similarly, a height $H_A$ of the apertures 31 can be selected so that the height $H_A$ it is greater than, less than, or equal to the diameter $d_V$ of the via 100. The width $W_S$ of the shield 33 can be selected so that the width $W_S$ is greater than or equal to the diameter $d_V$ of the hole 130. The width $W_S$ of the shield 33 should be selected to ensure that a lead-free solder paste that is applied to the stencil 50 does not enter into the hole 130. Preferably, $W_A$ and $H_A$ are as small as allowable to permit good paste transfer and still wet the rim 130r of the via hole 130.

In FIG. 17a, the stencil 50 and the substrate 21 are urged into contact with each other and are in alignment A with each other so that the apertures 31 and the shield 33 are positioned over the pad 120 and the hole 130 respectively as was depicted in FIGS. 15a and 15b. A blade 69 can be used to apply a lead-free solder paste 60 (paste 60 hereinafter) to the stencil 50 to print the paste 60 only on the second portion 2p of the pad 120. That is, the shield 33 prevents (i.e. blocks) the paste 60 from entering the hole 130 or from being printed on the first portion 1p of the pad 120. If the via 100 is a through hole via, then there may be pads 120 on both sides of the substrate 21. However, the paste 60 need only be applied to the pad 120 on a side of the via 100 that the via 100 will be probed from by the arcuate blade probe 10.

Figure 17B:
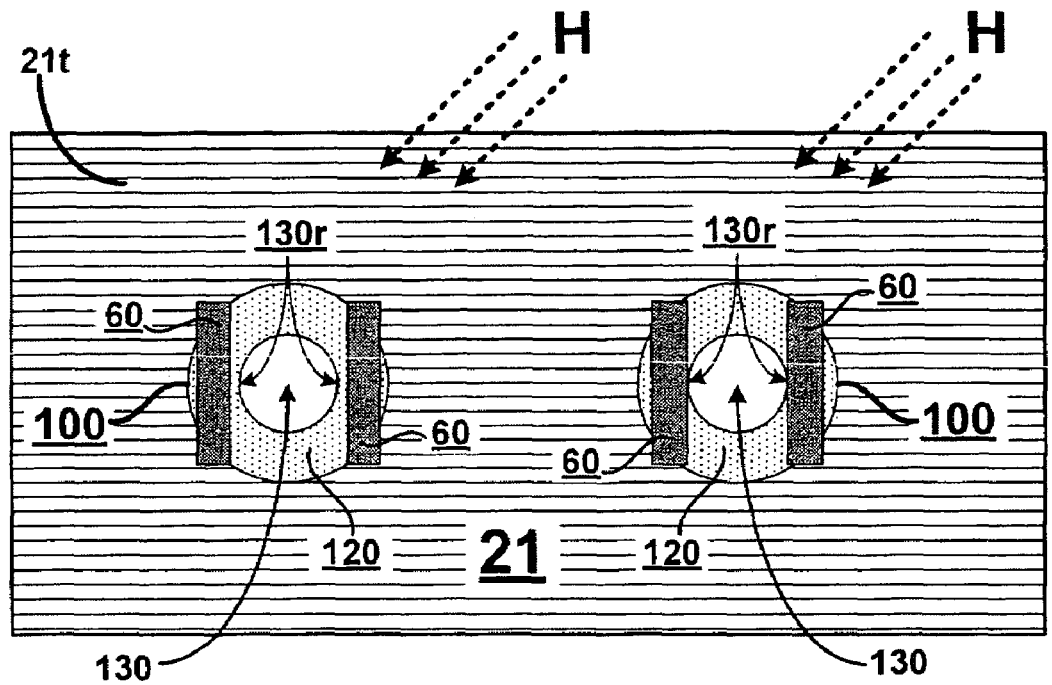
FIG. 17b is a top plan view depicting a lead-free solder paste applied to a second portion of a pad of a via.

In FIG. 17b, after the paste 60 is printed on the second portion 2p of the pads 120, the stencil 50 is removed from the substrate 21. After the removing, the paste 60 remains on the second portion 2p. If the edges 31e of the apertures 31 were aligned with the rim 130r, then a portion of the paste 60 abuts with a portion of the rim 130r of the hole 13 as is depicted by the via 100 on a right side of the substrate 21.

On the other hand, if the edges 31e were not aligned with the rim 130r, then the paste 60 can be inset from the rim 130r as is depicted on the via 100 on a left side of the substrate 21.

Subsequently, heat H is applied to reflow the paste 60. The process of heating a substrate, such as a PCB, for example, to reflow a lead-free solder paste is well understood in the electronics art. Accordingly, the reflowing can be accomplished by heating H the paste 60 and/or the substrate 21. During the reflowing, a flux 61 in the paste 60 drains through the hole 130 and a lead-free solder 62 (solder 62 hereinafter) in the paste 60 wets only a portion of a surface area of the pad 120 and remains on the pad 120. Unlike prior lead-free solder pasting processes where a pad of a via is pasted 1:1 or an entirety of the pad is over pasted (i.e. >1:1) by a lead-free solder paste, the reduced amount of the paste 60 results in a reduced amount of the solder 62 and a reduced amount of the flux 61. Therefore, very little or none of the solder 62 that wets the pad 120 flows into the hole 130. Consequently, the hole 130 is not filled up (i.e. is not plugged up) by the solder 62. Additionally, the reduced amount of the paste 60 also reduces the amount of the flux 61 so that a volume of the flux 61 that flows into the hole 130 during reflow is not sufficient to pool in the hole 130 thereby plugging the hole 130. Therefore, even if a small volume of the solder 62 flows into the hole 130 during the reflowing, that volume of solder 62 will not be sufficient to fill up the hole 130. As a result, the flux 61 that flows into the hole 130 does not have a foundation of solder 62 upon which to pool and the flux 61 does not reside at or near the rim 130r. Consequently, the hole 130 is not obstructed by the solder 62 or the flux 61 and can be probed during ICT.

Figure 17C:
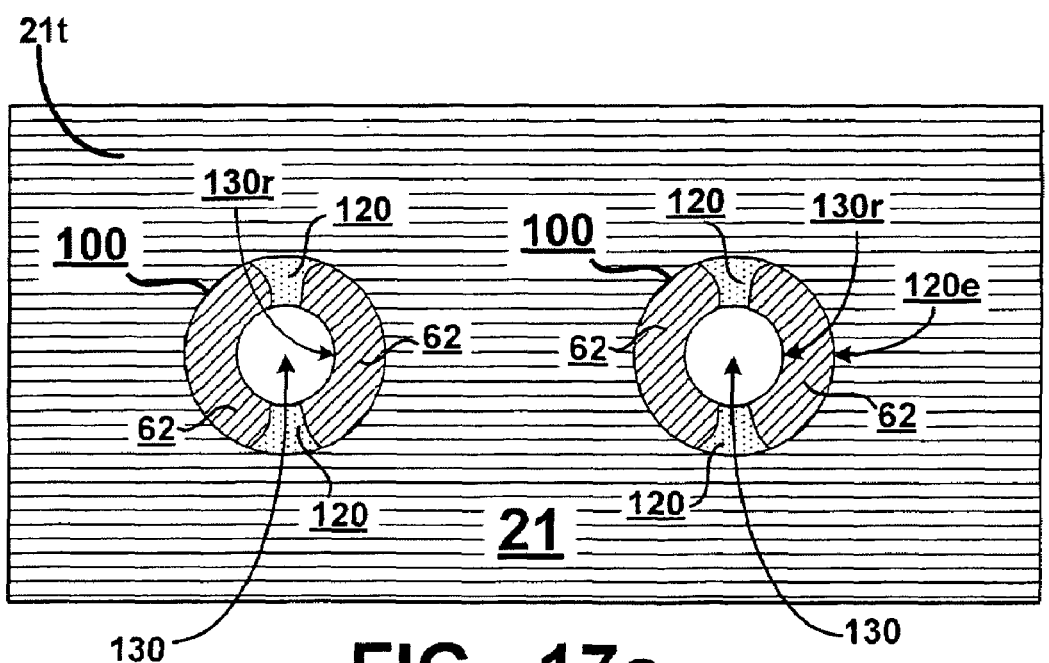
FIG. 17c is a top plan view depicting a lead-free solder connected with a second portion of a pad of a via after a reflowing process.

In FIG. 17c, after the reflowing, the solder 62 wets (i.e. covers) and adheres to the pad 120. During the reflowing, depending on how close to the rim 130r the paste 60 was applied to the pad 120, as the solder 62 wets the pad 120 some of the solder 62 may abut with and partially encircle the rim 130r. If the paste 60 was inset from the rim 130r, then after reflowing, the solder may partially encircle the rim 130r but may not abut with the rim 130r. Moreover, a remainder of the solder 62 covers a portion of a surface area of the pad 120. That surface area can include some or all of the second portion 2p and some of the first portion 1p. Depending on an amount of the paste 60 that is printed on the pad 120, a composition of the paste 60, the pattern 30, and a position of the paste 60 on the pad 120, the solder 62 may extend all the way to the edge 120e of the pad 120 after the reflowing. The resulting pattern of solder 62 formed on the pad 120 resembles the wings of a butterfly and the solder 62 is symmetrically positioned around the hole 130. Additionally, a surface coating including but not limited to an organic solderability preservative (OSP) may be applied to the pad 120. Typically, the OSP is applied to the pad 120 during the manufacturing of the PCB or PCA and prior to the applying of the paste 60.

h. Probing a Butterfly Pattern of a Lead-Free Solder

In FIG. 18a, the solder 62 is symmetrically positioned around the hole 130 and on opposite sides of a node axis $A_N$ that symmetrically bisects that pad 120 through the first portion 1p. Preferably, when the via 100 is probed using the arcuate blade probe 10, the edge axis $A_E$ of the edge 15 has a preferred orientation Δ with respect to the node axis $A_N$ such that an angle between the edge axis $A_E$ and the node axis $A_N$ is substantially a right angle (i.e. Δ is 90 degrees). The edge 15 makes the contact C with the solder 62 at a first portion and a second portion. In FIG. 18a, the probe axis $A_P$ and the via axis $A_V$ are aligned. However, as was described above in reference to FIG. 13c, contact between the edge 15 and the solder 62 may still occur at a first portion when the probe axis $A_P$ and the via axis $A_V$ are not aligned. Moreover, as was described above in reference to FIG. 13b, when the solder 62 is inset from the rim 130r, the contact C may occur at the first portion and the second portion.

In FIG. 18b, even if the probe axis $A_P$ and the via axis $A_V$ are aligned, the edge 15 may be rotated out of a substantially perpendicular alignment with the node axis $A_N$ by an angle $\Delta_1$. For example, the angle $\Delta_1$ can be ±15 degrees from the preferred orientation $\Delta$. However, even when the preferred orientation $\Delta$ is not obtained, the edge 15 may contact the solder 62 at a first portion and a second portion.

In FIGS. 19a through 19d, depict examples of how the preferred orientation $\Delta$ can be obtained. In FIG. 19a, the shaft 11 can include a key 11k and the barrel 72 can include a slot 72s that complements a shape of the key 11k. In FIG. 19b, when the shaft 11 is inserted i into the barrel 72 with the key 11k aligned with the slot 72s, the edge axis $A_E$ has a set orientation relative to the barrel 72. Preferably, the key 11k is symmetrically positioned on the shaft 11 so that the shaft 11 moves in the barrel 72 without binding in the cavity 78 as is depicted in FIG. 19c (i.e. a cross-sectional view along a line I—I of FIG. 19b).

Figure 20:
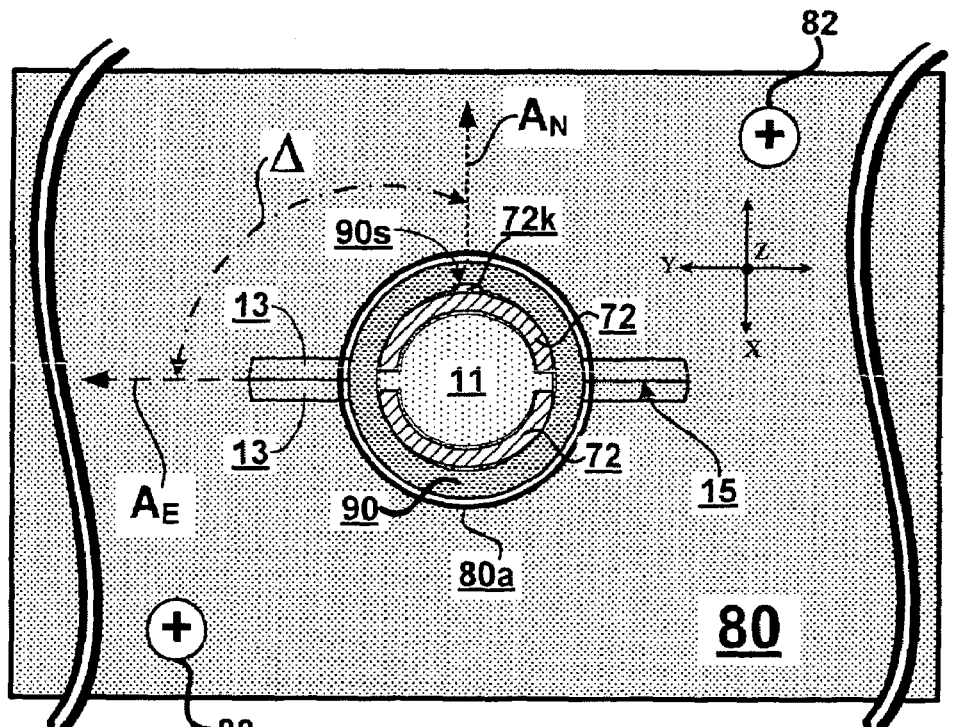
FIG. 20 is a top plan view depicting a receptacle connected with a test fixture with an axis of an edge of arcuate blade probe disposed in a preferred orientation.

Similarly, the barrel 72 can include a key 72k and the receptacle 90 can include a slot 90s that complements a shape of the key 72k. When the barrel 72 is inserted into the cavity 92 with the key 72k aligned with the slot 90s, the edge axis $A_E$ has set orientation relative to the receptacle 90. Moreover, in FIG. 20, if the receptacle 90 is mounted to a test fixture 80 in a proper orientation, then the edge axis $A_E$ will have the preferred orientation $\Delta$ with respect to the node axis $A_N$.

Figure 21:
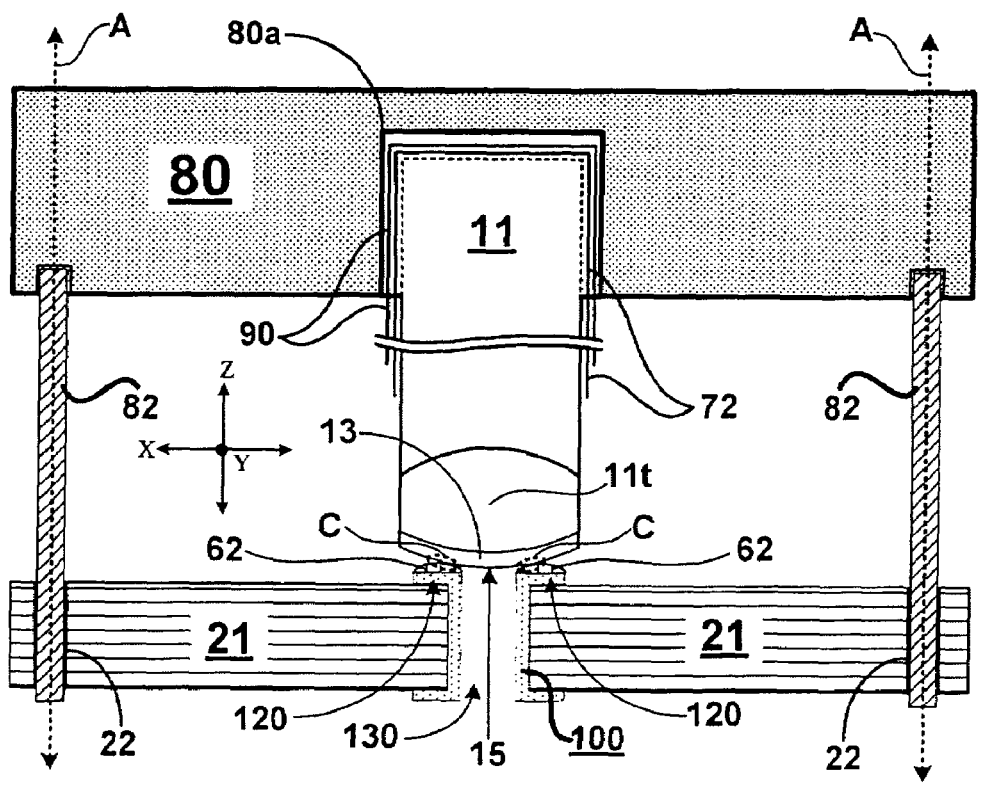
FIG. 21 is a cross-sectional view of a test fixture aligned with a board substrate with an edge of an arcuate blade probe in contact with a node.

For example, the receptacle 90 can be inserted into a bore 80a in the test fixture 80 with the structure 98 providing a friction fit between the bore 80a and the receptacle 90. The receptacle 90 can then be rotated in the bore 80a to obtain the preferred orientation $\Delta$ of the edge axis $A_E$. In FIG. 21, a set of pins 82 on the test fixture 80 can be inserted into apertures 22 on the substrate 21 to align A the test fixture 80 with the substrate 21 in preparation for ICT. The alignment A and the mounting of the receptacle 90 in the bore 80a, also aligns the arcuate blade probe 10 with the via 100 to be probed and positions the edge 15 in the preferred orientation $\Delta$ so that the edge axis $A_E$ and the node axis $A_N$ are substantially perpendicular to each other.

i. Correcting ICT Fixture Manufacturing Defects

The fixed (preferred) orientation of the arcuate blade probe 10 may also be used to correct for probe to target misalignments derived from ICT fixture defects. In this case, a fixed orientation probe may be used to improve contact repeatability with the test pads 120 or vias 100. Furthermore, a fixed orientation probe could also be embodied as non-symmetrical (not shown). In this case, when a shaft is mis-aligned with a node, the preferred orientation, non-symmetrical probe can be used to center the blade over the node. The preferred orientation may also be used to avoid contact with adjacent nodes, traces and components.

Although several embodiments of the present invention have been disclosed and illustrated, the invention is not limited to the specific forms or arrangements of parts so described and illustrated. The invention is only limited by the claims.

What is claimed is:

1. An arcuate blade probe for probing a node of a circuit, comprising:

a shaft made from an electrically conductive material, the shaft having a longitudinal axis and a first dimension transverse to the longitudinal axis, the shaft further having a plunger body including a dimension that is less than the first dimension of the shaft and a plunger tail connected with the plunger body;

the shaft including a pair of faces positioned about a probe axis in facing opposition to each other, the faces converge towards each other along the probe axis at a face angle, the faces terminate at an edge;

the edge including an arcuate profile having a radius of curvature, the radius of the profile greater than half the first dimension;

a barrel including a cavity adapted to receive at least a portion of the plunger body and permit movement of the shaft along the probe axis, the plunger body structured and arranged to maintain the orientation of the arcuate profile upon contact with node.

2. The arcuate blade probe as set forth in claim 1, wherein the edge is operative to make a contact with the node at any portion or portions along the edge when the edge and the node are urged into contact with each other.

3. The arcuate blade probe as set forth in claim 1, wherein the edge is symmetrically aligned with the probe axis.

4. The arcuate blade probe as set forth in claim 1, wherein the arcuate profile of the edge comprises a profile comprised of at least one of a portion of a circular profile, a portion of an elliptical profile, a portion of an oval profile, a portion of a curve function.

5. The arcuate blade probe as set forth in claim 1, wherein the face angle is in a range that allows the edge to penetrate through non-conductive oxides and contaminants on the node.

6. The arcuate blade probe as set forth in claim 1 and further comprising:

a spring positioned in the cavity;

a means for retaining the shaft in the cavity; and a means to allow the plunger to move within the barrel while maintaining contact with the spring as the spring compresses and expands according to the shaft movement.

7. The arcuate blade probe as set forth in claim 6, wherein the means for retaining the shaft in the cavity comprises a crimp in the barrel and the crimp is in contact with the plunger tail and is operative to retain the shaft in the barrel with the spring compressed and in contact with the plunger tail.

8. An arcuate blade probe for probing a node of a circuit, comprising:

a shaft made from an electrically conductive material, the shaft having a longitudinal axis and a first dimension transverse to the longitudinal axis, the shaft further having a plunger body including a second dimension that is less than the first dimension of the shaft and a plunger tail connected with the plunger body:

the shaft including a pair of faces positioned about a probe axis in facing opposition to each other, the faces converge towards each other along the probe axis at a face angle, the faces terminate at an edge, the edge including an arcuate profile having a radius of curvature, the radius of the profile greater than half the first dimension, wherein the edge is operative to make a contact with the node at any portion or portions along the edge when the edge and the node are urged into contact with each other;

a barrel including a cavity adapted to receive at least a portion of the plunger body and permit movement of the shaft along the probe axis, the plunger body structured and arranged to maintain the orientation of the arcuate profile upon contact with node; and wherein the arcuate profile of the edge comprises a profile comprised of at least one of a portion of a circular profile, a portion of an elliptical profile, a portion of an oval profile, a portion of a curved function.

9. The arcuate blade probe as set forth in claim 8, wherein the edge makes contact with the node in a preferred orientation.

10. A method of using an arcuate blade probe for probing a node of a circuit, comprising:

providing a probe having;

a longitudinal probe axis;

a shaft made from an electrically conductive material, the shaft concentric to the probe axis and having a first dimension transverse to the longitudinal axis, the shaft further having a plunger body including a second dimension that is less than the first dimension of the shaft and a plunger tail connected with the plunger body, the shaft including a pair of faces positioned about the probe axis in facing opposition to each other, the faces converge towards each other along the probe axis at a face angle, the faces terminate at an arcuate edge having a radius of curvature greater than half the first dimension;

a barrel including a cavity adapted to receive at least a portion of the plunger body and permit movement of the shaft along the probe axis;

urging the probe to contact the node, the plunger body structured and arranged to maintain the orientation of the arcuate profile upon contact with the node;

electrically evaluating the node; and extracting the probe from the node, the extraction revealing at least one arcuate indentation.

11. A method of using an arcuate blade probe for probing a through hole via providing a central axis a pad about a hole concentric to the axis and solder upon the pad, comprising:

providing an arcuate edge probe having;

a shaft made from an electrically conductive material and having a first dimension transverse to a longitudinal axis, the shaft including a pair of faces positioned about a probe axis in facing opposition to each other, the faces converge towards each other along the probe axis at a face angle, the faces terminate at an edge, he edge including an arcuate profile having a radius of curvature greater than half the first dimension, wherein the edge is operative to make a contact with the node at any portion or portions along the edge when the edge and the node are urged into contact with each other;

a barrel including a cavity adapted to receive at least a portion of the shaft opposite from the pair of faces and permit movement of the shaft along the probe axis; and wherein the arcuate profile of the edge comprises a profile comprised of at least one of a portion of a circular profile, a portion of an elliptical profile, a portion of an oval profile, a portion of a curved function;

urging the probe to contact solder upon the pad of the through hole via, the barrel and shaft structured and arranged to maintain the orientation of the arcuate edge upon contact with the solder;

disposing the probe along the longitudinal axis into the solder;

electrically evaluating the through hole via; and extracting the probe from the solder.

* * * * *

UNITED STATES PATENT AND TRADEMARK OFFICE
CERTIFICATE OF CORRECTION

PATENT NO. : 7,248,065 B2  Page 1 of 1
APPLICATION NO. : 11/221258
DATED : July 24, 2007
INVENTOR(S) : Alexander Leon It is certified that error appears in the above-identified patent and that said Letters Patent is hereby corrected as shown below:

In column 1, line 6, delete "Mar. 3, 2005" and insert -- Apr. 22, 2005 --, therefor.

In column 14, line 55, in Claim 8, delete "body:" and insert -- body; --, therefor.

In column 16, line 13, in Claim 11, before "edge" delete "he" and insert -- the --, therefor.

Signed and Sealed this

Fourteenth Day of October, 2008

JON W. DUDAS
*Director of the United States Patent and Trademark Office*